United States Patent
Sorori et al.

[11] Patent Number: 6,140,384
[45] Date of Patent: Oct. 31, 2000

[54] PHOTOPOLYMERIZABLE COMPOSITION CONTAINING A SENSITIZING DYE WITH CYANO OR SUBSTITUTED CARBONYL GROUPS

[75] Inventors: Tadahiro Sorori; Yasuo Okamoto, both of Shizuoka, Japan

[73] Assignee: Fuji Photo Film Co., Ltd., Ashigara, Japan

[21] Appl. No.: 08/942,198

[22] Filed: Oct. 1, 1997

[30] Foreign Application Priority Data

Oct. 2, 1996 [JP] Japan .................................. 8-281454

[51] Int. Cl.$^7$ .............................. C08F 2/50; G03C 1/73; G03F 7/028; G03F 7/029
[52] U.S. Cl. ............................ 522/12; 522/13; 522/14; 522/15; 522/16; 522/18; 522/26; 522/29; 522/182; 430/281.1
[58] Field of Search ................... 522/16, 26, 29, 522/12, 18, 182, 13, 14, 15; 430/281.1

[56] References Cited

U.S. PATENT DOCUMENTS

| | | | |
|---|---|---|---|
| 5,049,481 | 9/1991 | Okamoto et al. | 522/66 |
| 5,064,747 | 11/1991 | Imai et al. | 522/16 |
| 5,202,221 | 4/1993 | Imai et al. | 522/16 |
| 5,229,253 | 7/1993 | Zertani et al. | 522/26 |
| 5,609,992 | 3/1997 | Sorori et al. | 522/16 |
| 5,691,394 | 11/1997 | Kondo | 522/29 |
| 5,700,849 | 12/1997 | Kondo et al. | 522/16 |
| 5,721,288 | 2/1998 | Aotani et al. | 522/16 |
| 5,731,363 | 3/1998 | Okamoto et al. | 522/16 |
| 5,776,996 | 7/1998 | Okamoto et al. | 522/29 |
| 5,801,212 | 9/1998 | Okamoto et al. | 522/16 |

*Primary Examiner*—Susan W. Berman
*Attorney, Agent, or Firm*—Burns, Doane, Swecker & Mathis, LLP

[57] ABSTRACT

A photopolymerizable composition comprising i) an addition polymerizable compound having an ethylenically unsaturated double bond, ii) a sensitizing dye represented by the following formula (I) and iii) a titanocene compound:

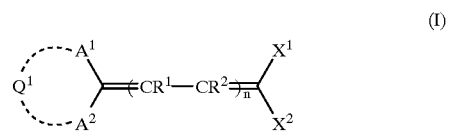

(I)

wherein $A^1$ and $A^2$ each represents a carbon atom or a hetero atom, $Q^1$ represents a nonmetallic atom group necessary for forming a heterocyclic ring together with $A^1$, $A^2$ and the carbon atoms adjacent thereto, $R^1$ and $R^2$ each represents a hydrogen atom, an alkyl group or an aryl group and $R^1$ and $R^2$ may be combined with each other to form a ring, $X^1$ and $X^2$ each represents a cyano group or a substituted carbonyl group and $X^2$ and $X^2$ may be combined with each other to form a ring, and n represents 0, 1 or 2.

9 Claims, No Drawings

PHOTOPOLYMERIZABLE COMPOSITION CONTAINING A SENSITIZING DYE WITH CYANO OR SUBSTITUTED CARBONYL GROUPS

FIELD OF THE INVENTION

The present invention relates to a photopolymerizable composition, more particularly, the present invention relates to a photopolymerizable composition highly sensitive to light rays in the visible light region and capable of showing good sensitivity also to, for example, $Ar^+$ laser light and YAG-SHG laser light.

BACKGROUND OF THE INVENTION

A large number of image formation methods using a photopolymerization system have been conventionally known and widely used in the fields such as printing plate, printed circuit, paint, ink, hologram recording and three dimensional formation. For example, there are known a method where a photopolymerizable composition comprising an addition-polymerizable compound having an ethylenic double bond, a photopolymerization initiator and further, if desired, an organic polymer binder and a thermal polymerization inhibitor, is provided on a support to form a film layer, the layer is imagewise exposed to a desired image to cure the exposed area by polymerization and then the unexposed area is dissolved and removed to form a cured relief image, a method where a layer comprising the above-described photopolymerizable composition is provided between two supports, at least one support being transparent, the layer is imagewise exposed from the transparent support side to induce change in the adhesive strength by light and then the support is peeled off to form an image, a method where a photosensitive material having a microcapsule layer containing a photopolymerizable composition and a coloring material such as a leuco dye is prepared, the photosensitive material is imagewise exposed to photocure the capsules in the exposed area, the capsules in the unexposed area are ruptured by pressure or heat treatment to put it into contact with the coloring material developer to effect color formation to thereby form a color image, an image formation method using the change in the toner adhesion property of the photopolymerizable composition due to light, and an image formation method using the change in the refractive index of the photopolymerizable composition due to light.

The photopolymerizable composition applied to these methods uses in many cases benzyl, benzoin ether, Michler's ketone, anthraquinone, acridine, phenazine or benzophenone as a photopolymerization initiator. However, these photopolymerization initiators are extremely low in the photopolymerization initiation ability to the visible light of 400 nm or more as compared with the photopolymerization initiation ability to the ultraviolet light of 400 nm or less and accordingly, these are remarkably limited in the application range.

Recently, as the image formation technique has been developed, a photopolymer having high sensitivity to light rays in the visible region is being demanded. The photopolymer is a photosensitive material suitable, for example, for non-contact type plates using projection exposure or for plates using a visible light laser. Highly expected as the visible light laser are $Ar^+$ laser which emits light of 488 nm and a YAG-SHG laser which emits light of 532 nm.

With respect to the photopolymerization initiation system sensitive to light rays in the visible light region, many proposals have been hitherto made. Examples of the system include a certain kind of sensitive dyes described in U.S. Pat. No. 2,850,445, a composite initiation system of a dye and an amine (see, JP-B-44-20189 (the term "JP-B" as used herein means an "examined Japanese patent publication")), a combination system of hexaarylbiimidazole, a radical generating agent and a dye (see, JP-B-45-37377), a system of hexaarylbiimidazole and p-dialkylaminobenzylidene ketone (see, JP-B-47-2528, JP-A-54-155292 (the term "JP-A" as used herein means an "unexamined published Japanese patent application")), a system of a cyclic cis-α-dicarbonyl compound and a dye (see, JP-A-48-84183), a system of a substituted triazine and a merocyanine dye (see, JP-A-54-151024), a system of 3-ketocoumarin and an activator (see, JP-A-52-112681, JP-A-58-15503), a system of biimidazole, a styrene derivative and a thiol (see, JP-A-59-140203), a system of an organic peroxide and a dye (see, JP-A-59-140203, JP-A-59-189340) and a system of a dye having a rhodanine skeleton and a radical generating agent (see, JP-A-2-244050).

The titanocene is effective as a photopolymerization initiator as described in JP-A-59-152396, JP-A-61-151197, JP-A-63-10602, JP-A-63-41484 and JP-A-3-12403, and examples of the combination use system thereof include a system of titanocene and a 3-ketocoumarin dye (see, JP-A-63-221110), a system where titanocene, a xanthene dye and further, an addition-polymerizable ethylenically unsaturated compound containing an amino group or a urethane group are used in combination (see, JP-A-4-221958, JP-A-4-219756) and a system of titanocene and a specific merocyanine dye (see, JP-A-6-295061).

These conventional techniques are surely effective to visible light rays, however, they are bound to problems such that the sensitivity is insufficient, hence, these systems cannot be used in practice.

SUMMARY OF THE INVENTION

The object of the present invention is to provide a highly sensitive photopolymerizable composition, particularly, a photopolymerizable composition highly sensitive to visible light rays of 400 nm or more and to light of 488 nm or 532 nm corresponding to the output of an $Ar^+$ layer or YAG-SHG laser, respectively.

The present inventors have found that a combination system of a sensitizing dye having a specific structure and a titanocene compound capable of generating active radicals on irradiation of light in the presence of the sensitizing dye exhibits very high sensitivity to the visible light rays of 400 nm or more, and based on this finding, the present invention of the following item (1) has been accomplished. A preferred embodiment thereof is the invention of item (2).

(1) A photopolymerizable composition comprising i) an addition polymerizable compound having an ethylenically unsaturated double bond, ii) a sensitizing dye represented by the following formula (I) and iii) a titanocene compound:

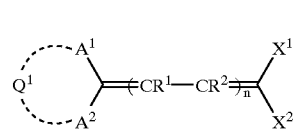

wherein $A^1$ and $A^2$ each represents a carbon atom or a hetero atom, $Q^1$ represents a nonmetallic atom group necessary for forming a heterocyclic ring together with $A^1$, $A^2$ and the carbon atom adjacent thereto (i.e., the carbon atom which bonds to both $A^1$ and $A^2$), $R^1$ and $R^2$ each represents a hydrogen atom, an alkyl group or an aryl group and $R^1$ and $R^2$ may be combined with each other to form a ring, $X^1$ and $X^2$ each represents a cyano group or a substituted carbonyl group and $X^1$ and $X^2$ may be combined with each other to form a ring, and n represents 0, 1 or 2.

(2) The photopolymerizable composition of item (1), wherein the photopolymerizable initiation system comprising ii) a sensitizing dye and iii) a titanocene compound further contains at least one compound selected from the group consisting of the following compounds (a) to (h):

(a) a compound having a carbon-halogen bond;

(b) a ketone compound represented by the following formula (II):

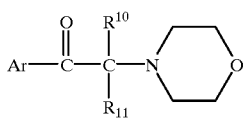

(II)

wherein Ar represents an aromatic group represented by the following formula, $R^{10}$ and $R^{11}$ each represents a hydrogen atom or an alkyl group, $R^{10}$ and $R^{11}$ may be combined with each other to form a ring together with the carbon atom, which bonds to both $R^{10}$ and $R^{11}$, and the ring formed by $R^{10}$, $R^{11}$ and the carbon atom may be a divalent group linking the carbonyl group and the morpholino group:

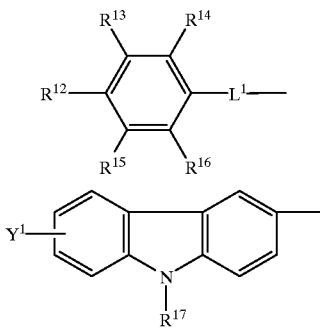

wherein $R^{12}$, $R^{13}$, $R^{14}$, $R^{15}$ and $R^{16}$, which may be the same or different, each represents a hydrogen atom, a halogen atom, an alkyl group, an alkenyl group, an aryl group, a hydroxyl group, an alkoxy group, —S—$R^{18}$, —SO—$R^{18}$ or —SO$_2$—$R^{18}$ (wherein $R^{18}$ represents a hydrogen atom, an alkyl group or an alkenyl group), $L^1$ represents a bond or an alkylene group, provided that when $L^1$ is a bond, at least one of $R^{12}$, $R^{13}$, $R^{14}$, $R^{15}$ and $R^{16}$ is —S—$R^{18}$ or —SO—$R^{18}$, $R^{17}$ represents a hydrogen atom, an alkyl group or an acyl group, and $Y^1$ represents a hydrogen atom or a substituted carbonyl group represented by the following formula:

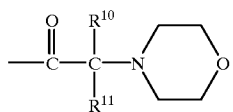

wherein $R^{10}$ and $R^{11}$ each has the same meaning as defined in formula (II);

(c) a ketoxime compound represented by the following formula (III):

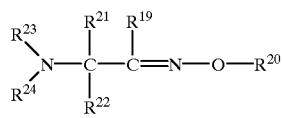

(III)

wherein $R^{19}$ and $R^{20}$, which may be the same or different, each represents an aliphatic hydrocarbon group, an aromatic hydrocarbon group or a heterocyclic group, $R^{21}$ and $R^{22}$, which may be the same or different, each represents a hydrogen atom, an aliphatic hydrocarbon group, an aromatic hydrocarbon group, a heterocyclic group, a hydroxy group, a substituted oxy group, a mercapto group or a substituted thio group, $R^{23}$ and $R^{24}$ each represents a hydrogen atom, an aliphatic hydrocarbon group, an aromatic hydrocarbon group or a substituted carbonyl group, $R^{23}$ and $R^{24}$ may be combined with each other to form a ring having from 2 to 8 carbon atoms, and the ring may contain at least one of —O—, —NR$^{23}$— (wherein $R^{23}$ has the same meaning as above), —O—CO—, —NH—CO—, —S— and —SO$_2$— in the linking main chain;

(d) an organic peroxide;

(e) a thio compound represented by the following formula (IV):

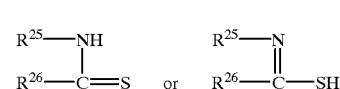

(IV)

wherein $R^{25}$ represents an alkyl group or an aryl group, $R^{26}$ represents a hydrogen atom or an alkyl group, $R^{25}$ and $R^{26}$ may be combined with each other to provide an atomic group necessary for completing a heterocyclic ring which may have a condensed ring, together with the carbon atom and the nitrogen atom;

(f) hexaarylbiimidazole;

(g) an aromatic onium salt; and (h) a ketoxime ester.

DETAILED DESCRIPTION OF THE INVENTION

The present invention is described below in detail.

The photopolymerizable composition of the present invention comprises i) an addition polymerizable compound having at least one ethylenically unsaturated double bond, and as the photopolymerizable initiation system ii) a sensitizing dye represented by formula (I) and iii) a titanocene compound.

The above-described i) polymerizable compound having an addition polymerizable unsaturated bond is selected from the compounds having at least one, preferably two or more terminal ethylenically unsaturated bonds. In other words, the compound has a chemical form such as a monomer, a prepolymer, namely, a dimer, a trimer or an oligomer, a mixture thereof or a copolymer thereof. Examples of the monomer and the copolymer thereof include an ester of an unsaturated carboxylic acid (e.g., acrylic acid, methacrylic acid, itaconic acid, crotonic acid, isocrotonic acid, maleic acid) with an aliphatic polyhydric alcohol compound and an amide of an unsaturated carboxylic acid with an aliphatic polyamine compound.

Specific examples of the ester monomer of an aliphatic polyhydric alcohol compound with an unsaturated carboxylic acid include:

an acrylic ester such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer;

a methacrylic ester such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane;

an itaconic ester such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate;

a crotonic ester such as ethylene glycol dicrotonate, tetramethylene glycol dicrotonate, pentaerythritol dicrotonate and sorbitol tetradicrotonate;

an isocrotonic ester such as ethylene glycol diisocrotonate, pentaerythritol diisocrotonate and sorbitol tetraisocrotonate;

a maleic ester such as ethylene glycol dimaleate, triethylene glycol dimaleate, pentaerythritol dimaleate and sorbitol tetramaleate; and a mixture of these ester monomers.

Specific examples of the amide monomer of an aliphatic polyhydric amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other examples include vinylurethane compounds having two or more polymerizable vinyl groups in one molecule which are prepared by reacting a vinyl monomer containing a hydroxyl group represented by the following formula (V) with a polyisocyanate compound having two or more isocyanate groups in one molecule described in JP-B-48-41708:

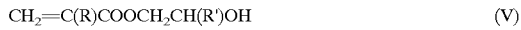

CH$_2$=C(R)COOCH$_2$CH(R')OH     (V)

(wherein R and R' each represents H or CH$_3$).

Further, polyfunctional acrylates and methacrylates such as urethane acrylates as described in JP-A-51-37193, polyester acrylates as described in JP-A-48-64183, JP-B-49-43191 and JP-B-52-30490 and epoxy acrylates obtained by reacting an epoxy resin with a (meth)acrylic acid, may be used. Furthermore, those described in *Nippon Secchaku Kyokai-shi* (*Journal of Adhesion Society of Japan*), vol. 20, No. 7, pp. 300–308 (1984) as photo-curable monomers and oligomers may be used. The amount of the compound may be freely selected but it is preferably from 5 to 80 wt % (% by weight), more preferably from 5 to 55%, still more preferably from 10 to 55 wt %, particularly preferably from 10 to 50 wt %, more particularly preferably from 10 to 40 wt %, based on all components of the composition. These compounds may be used either individually or in combination of two or more thereof.

As the photopolymerizable initiation system in the photopolymerizable composition of the present invention, ii) a sensitizing dye represented by formula (I) above is contained.

Formula (I) is described below. $A^1$ and $A^2$, which may be the same or different, each represents a carbon atom or a hetero atom, and $Q^1$ represents an atomic group necessary for forming a heterocyclic ring together with $A^1$, $A^2$ and the carbon atom.

The carbon atom represented by $A^1$ or $A^2$ is bonded with one or two selected from a hydrogen atom and substituents such as an alkyl group and an aryl group.

The hetero atom represented by $A^1$ or $A^2$ is an oxygen atom, a sulfur atom or a nitrogen atom, and the nitrogen atom may be bonded with one selected from a hydrogen atom and substituents such as an alkyl group and an aryl group.

At least one of $A^1$ and $A^2$ is preferably a hetero atom, more preferably $NR^3$ or S (wherein $R^3$ represents a hydrogen atom, an alkyl group, a substituted alkyl group, an alkenyl group, a substituted alkenyl group, an alkoxycarbonyl group, an aryl group, a substituted aryl group, an alkynyl group or a substituted alkynyl group).

The alkyl group represented by $R^3$ includes linear, branched and cyclic alkyl groups each having from 1 to 20 carbon atoms and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these, preferred are a linear alkyl group having from 1 to 12 carbon atoms, a branched alkyl group having from 3 to 12 carbon atoms and a cyclic alkyl group having from 5 to 10 carbon atoms, more preferred is a linear alkyl group having from 1 to 12 carbon atoms.

The substituent of the substituted alkyl group represented by $R^3$ includes a monovalent nonmetallic atom group (excluding a hydrogen atom) and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and a conjugated base group thereof (hereinafter called a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and a conjugate base group thereof (hereinafter called a phosphonato group, including a metal salt thereof), a dialkylphosphono group (—PO$_3$(alkyl)$_2$; alkyl=an alkyl group, hereinafter the same), a diarylphosphono group (—PO$_3$(aryl)$_2$; aryl=an aryl group, hereinafter the same), an alkylarylphosphono group (—PO$_3$(alkyl)(aryl)), a monoalkylphosphono group (—PO$_3$(alkyl)) and a conjugated base group thereof (hereinafter called an alkyl phosphonato group, including a metal salt thereof), a monoarylphosphono group (—PO$_3$H(aryl)) and a conjugated base group thereof (hereinafter called an aryl phosphonato group, including a metal salt thereof), a phosphonooxy group (—OPO$_3$H$_2$) and a conjugated base group thereof (hereinafter called a phosphonato oxy group, including a metal salt thereof), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and a conjugated base group thereof (hereinafter called an alkyl phosphonato oxy group, including a metal salt thereof), a monoarylphosphonooxy group (—OPO$_3$H(aryl)) and a conjugated base group thereof (hereinafter called an aryl phosphonato oxy group, including a metal salt thereof), a cyano group, a nitro group, an aryl group, an alkenyl group and an alkynyl group.

Specific examples of the alkyl group in these substituents include the above-described alkyl groups and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a cyanophenyl group, a sulfophenyl group, a sulfonato phenyl group, a phosphonophenyl group and a phosphonato phenyl group.

Examples of the alkenyl group in the substituents of the substituted alkyl group include a vinyl group, a 1-propenyl group, a 1-butenyl group, a cinnamyl group and a 2-chloro-1-ethenyl group and examples of the alkynyl group include an ethynyl group, a 1-propynyl group, a 1-butynyl group and a trimethylsilylethynyl group. Examples of G$^1$ in the acyl group (G$^1$CO—) include hydrogen and the above-described alkyl and aryl groups. Among these substituents, more preferred are a halogen atom (—F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N -arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonato oxy group, an aryl group and an alkenyl group.

The alkylene group in the substituted alkyl group includes a divalent organic residue resulting from eliminating any one of hydrogen atoms on the above-described alkyl group having from 1 to 20 carbon atoms and preferred are a linear alkylene group having from 1 to 12 carbon atoms, a branched alkylene group having from 3 to 12 carbon atoms and a cyclic alkylene group having from 5 to 10 carbon atoms. Specific examples of the substituted alkyl group represented by R$^3$ and obtained by combining a substituent described above with the alkylene group include a chloromethyl group, a bromomethyl group, a 2-chloroethyl group, a trifluoromethyl group, a methoxymethyl group, a methoxyethoxyethyl group, an allyloxymethyl group, an allyloxyethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxymethyl group, a carboxypropyl group, a methoxycarbonylethyl group, an allyloxycarbonylbutyl group, a chlorophenoxycarbonylmethyl group, a hexyloxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonato ethyl group, a sulfonato butyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonato hexyl group, a diethylphosphonobutyl group, a diphenylphosphonopropyl group, a methylphosphonobutyl group, a methyl phosphonato butyl group, a tolylphosphonohexyl group, a tolyl phosphonato hexyl group, a phosphonooxypropyl group, a phosphonato oxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

The aryl group represented by $R^3$ includes those where from 1 to 3 benzene rings form a condensed ring and a group derived from those where a benzene ring and a 5-membered unsaturated ring form a condensed ring. Specific examples thereof include a phenyl group, a naphthyl group, an anthryl group, a phenanthryl group, an indenyl group, an acenaphthenyl group and a fluorenyl group, and among these, preferred are a phenyl group and a naphthyl group.

The substituted aryl group represented by $R^3$ includes those having a monovalent nonmetallic atom group exclusive of hydrogen, as a substituent on the ring-forming carbon atoms of the above-described aryl group. Preferred examples of the substituent include the above-described alkyl groups, substituted alkyl groups and substituents of the substituted alkyl group. Preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonato phenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonato phenyl group, a diethyiphosphonophenyl group, a diphenyiphosphonophenyl group, a methylphosphonophenyl group, a methyl phosphonato phenyl group, a tolylphosphonophenyl group, a tolyl phosphonato phenyl group, an allyl group, a 1-propenylmethyl group, a 2-butenyl group, a 2-methylallylphenyl group, a 2-methylpropenylphenyl group, a 2-propenylphenyl group, a 2-butylphenyl group and a 3-butynylphenyl group.

The alkenyl group represented by $R^3$ include linear, branched and cyclic alkenyl group each having from 1 to 20 carbon atoms.

Examples of the substituent of the substituted alkenyl group represented by $R^3$ include the substituents described above for the substituted alkyl group.

Specific examples of the alkenyl group and the substituted alkenyl group represented by $R^3$ include a vinyl group, a 1-propenyl group, a 1-butenyl group, a 1-methyl-1-propenyl group, a styryl group, a pentenyl group and a 2-cyclohexinyl group.

The alkynyl group represented by $R^3$ includes linear, and branched alkynyl group each having from 1 to 20 carbon atoms.

Examples of the substituent of the substituted alkynyl group represented by $R^3$ include the substituents described above for the substituted alkyl group.

Specific examples of the alkynyl group and the substituted alkynyl group represented by $R^3$ include an ethynyl group, a 2-phenylethynyl group and a 1-butynyl group.

The alkoxycarbonyl group represented by $R^3$ includes a residue resulting from the bonding of a linear, branched or cyclic alkyl group having from 1 to 10 carbon atoms to an oxycarbonyl group, and specific examples thereof include a methoxycarbonyl group, an ethoxycarbonyl group, a propoxycarbonyl group, a butoxycarbonyl group, a secbutoxycarbonyl group and a tert-butoxycarbonyl group.

$R^3$ is as described in the foregoing, however, in the present invention, preferred are an alkyl group, a substituted alkyl group, an alkenyl group, a substituted alkenyl group, an alkynyl group and a substituted alkynyl group, more preferred are a unsubstituted linear alkyl group and a substituted alkyl group substituted by an alkoxy group, a carboxyl group, a sulfonato group or an alkoxycarbonyl group.

$Q^1$ in formula (I) is described below. $Q^1$ represents a nonmetallic atom group necessary for forming a heterocyclic ring together with $A^1$, $A^2$ and the carbon atom adjacent thereto. The heterocyclic ring is preferably a 5-, 6- or 7-membered nitrogen-containing or sulfur-containing heterocyclic ring, more preferably a 5- or 6-membered heterocyclic ring.

Preferred examples of the nitrogen-containing heterocyclic ring include those known as constituting the basic nucleus in a merocyanine dye described, for example, in L. G. Brooker et al., *J. Am. Chem. Soc.*, 73, 5326–5358 (1951) and bibliographies can be preferably used. Specific examples thereof include thiazoles (e.g., thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole), benzothiazoles (e.g., benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole, 5-ethoxycarbonylbenzothiazole), naphthothiazoles (e.g., naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole, 7-methoxynaphtho[1,2]thiazole, thianaphtheno-7',6',4,5-thiazoles (e.g., 4'-methoxythianaphtheno-7',6',4,5-thiazole), oxazoles (e.g., 4-methyloxazole, 5-methyloxazole, 4-phenyloxazole, 4,5-diphenyloxazole, 4-ethyloxazole, 4,5-dimethyloxazole, 5-phenyloxazole), benzoxazoles (e.g., benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole, 6-hydroxybenzoxazole), naphthoxazoles (e.g., naphth[1,2]oxazole, naphth[2,1]oxazole), selenazoles (e.g., 4-methylselenazole, 4-phenylselenazole), benzoselenazoles (e.g., benzoselenazole, 5-chlorobenzoselenazole, 5-methoxybenzoselenazole, 5-hydroxybenzoselenazole, tetrahydrobenzoselenazole), naphthoselenazoles (e.g., naphtho[1,2]selenazole, naphtho[2,1]selenazole), thiazolines (e.g., thiazoline, 4-methylthiazoline), 2-quinolines (e.g., quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, 8-hydroxyquinoline), 4-quinolines (e.g., quinoline, 6-methoxyquinoline, 7-methylquinoline, 8-methylquinoline), 1-isoquinolines (e.g., isoquinoline, 3,4-dihydroisoquinoline), 3-isoquinolines (e.g., isoquinoline), benzimidazoles (e.g., 1,3-diethylbenzimidazole, 1-ethyl-3-phenylbenzimidazole), 3,3-dialkylindolenines (e.g., 3,3-dimethylindolenine, 3,3,5-trimethylindolenine, 3,3,7-trimethylindolenine), 2-pyridines (e.g., pyridine, 5-methylpyridine) and 4-pyridines (e.g., pyridine).

Examples of the sulfur-containing heterocyclic ring include the dithiol partial structure in the dyes described, for example, in JP-A-3-296759.

Specific examples thereof include benzodithiols (e.g., benzodithiol, 5-t-butylbenzodithiol, 5-methylbenzodithiol), naphthodithiols (e.g., naphtho[1,2]dithiol, naphtho[2,1] dithiol) and dithiols (e.g., 4,5-dimethyldithiols, 4-phenyldithiols, 4-methoxycarbonyldithiols, 4,5-dimethoxycarbonylbenzodithiols, 4,5-ditrifluoromethyldithiol, 4,5-dicyanodithiol, 4-methoxycarbonylmethyldithiol, 4-carboxymethyldithiol).

Among the above-described nitrogen- or sulfur-containing heterocyclic rings formed by $Q^1$ together with $A^1$, $A^2$ and the carbon atom adjacent thereto in formula (I), preferred are thiazoles, benzothiazoles, naphthothiazoles, benzoxazoles, benzimidazoles and 3,3-dialkylindolenines, more preferred are thiazoles.

Examples of the heterocyclic ring completed by $Q^1$ are set forth below.

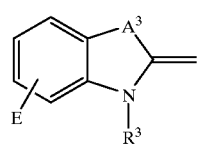
(Q-1)

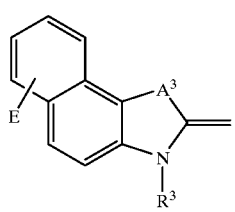
(Q-2)

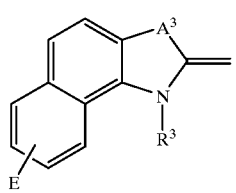
(Q-3)

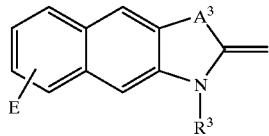
(Q-4)

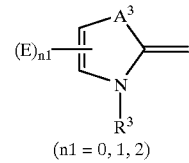
(Q-5)

(n1 = 0, 1, 2)

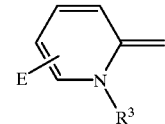
(Q-6)

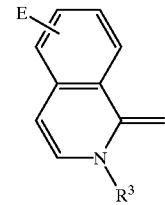
(Q-7)

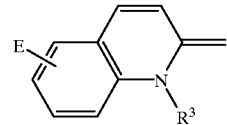
(Q-8)

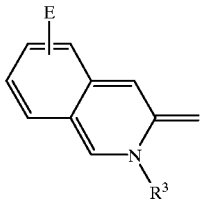
(Q-9)

In formulae (Q-1) to (Q-5), $A^3$ represents an oxygen atom, a sulfur atom, a nitrogen atom bonded with one selected from a hydrogen atom, an alkyl group and an aryl group, or a carbon atom bonded with two selected from a hydrogen atom, an alkyl group and an aryl group. Examples of the alkyl group and the aryl group in $A^3$ include those described above for $R^3$.

In formulae (Q-1) to (Q-9), $R^3$ has the same meaning as in $A^1$ or $A^2$ above, and the substituent E has σ Hammett's a value of from −0.9 to +0.5. Examples thereof include a hydrogen atom, a methyl group, an isopropyl group, a tert-butyl group, a phenyl group, a trifluoromethyl group, an acetyl group, an ethoxycarbonyl group, a carboxyl group, a carboxylato group (—COO⁻), an amino group, a methylamino group, a dimethylamino group, an ethylamino group, a diethylamino group, an acetylamino group, —PO₃H group, a methoxy group, an ethoxy group, a propoxy group, an isopropoxy group, a butoxy group, a benzyloxy group, a phenoxy group, a hydroxy group, an acetoxy group, a methylthio group, an ethylthio group, an isopropylthio group, a mercapto group, an acetylthio group, a thiocyano group (—SCN), a methylsulfonyl group, an ethylsulfinyl group, a methylsulfonyl group, an ethylsulfonyl group, an aminosulfonyl group, a dimethylsulfonyl group ($—S^+(CH_3)_2$), a sulfonato group ($—SO_2^-$), a fluorine atom, a chlorine atom, a bromine atom, an iodine atom, an iodyl group, a trimethylsilyl group ($—Si(CH_3)_3$), a triethylsilyl group and a trimethylstannyl group ($—Sn(CH_3)_3$). Among these substituents, preferred are a hydrogen atom, a methyl group, an ethyl group, a methoxy group, an ethoxy group, a dimethylamino group, a diethylamino group, a chlorine atom and a bromine atom.

$R^1$ and $R^2$ in formula (I) are specifically described below. $R^1$ and $R^2$ each independently represents a hydrogen atom, an alkyl group, a substituted alkyl group, an aryl group or a substituted aryl group. Preferred examples of the alkyl group, the substituted alkyl group, the aryl group and the substituted aryl group include the substituents described above as examples of $R^3$.

$R^1$ and $R^2$ each is preferably a hydrogen atom or a linear, branched or cyclic alkyl group having 10 or less carbon atoms.

$R^1$ and $R^3$ may be combined with each other to form a ring and specific examples thereof include the case where $R^1$ and $R^3$ are combined to form an alkylene group which may have a substituent, having from 2 to 10 carbon atoms. Examples of the ring formed together with a part of the methine chain include cyclopentene and cyclohexene.

$R^1$ and $R^2$ may be combined with each other to form a ring. Preferred examples thereof include the case where $R^1$ and $R^2$ are combined to form an alkylene group which may have a substituent, having from 3 to 10 carbon atoms. Examples of the ring formed together with a part of the methine chain include cyclopentane and cyclohexane. Examples of the compound having the above-described partial structure and represented by formula (I) include a part of merocyanine dyes described in U.S. Pat. No. 2,882,159.

$X^1$ and $X^2$ in formula (I) are specifically described below. $X^1$ and $X^2$ each independently represents a cyano group or a substituted carbonyl group, and $X^1$ and $X^2$ may be combined with each other to form a ring.

As the substituted carbonyl group ($G^2$—CO—) represented by $X^1$ or $X^2$, those where $G^2$ is a monovalent nonmetallic atom group can be used, specifically, those where $G^2$ is a substituted or unsubstituted alkyl group (specific examples thereof are the same as those described for $R^3$), a substituted or unsubstituted aryl group (specific examples thereof are the same as those described for $R^3$), a substituted or unsubstituted aromatic heterocyclic group (e.g., furyl, thienyl, pyridyl), a substituted or unsubstituted alkoxy group (e.g., methoxy, ethoxy, butoxy, benzyloxy), an aryloxy group (e.g., phenoxy) or a substituted or unsubstituted amino group (e.g., diethylamino, phenylamino), may be used. Preferred examples of the substituted carbonyl group include a formyl group, an acyl group, a furoyl group, a thenoyl group, a pyridinecarbonyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group or the aryl group in these groups include the alkyl group and the substituted alkyl group, or the aryl group and the substituted aryl group described above as examples of $R^3$, respectively. More preferred examples thereof include an acetyl group, a benzoyl group, a 2-furoyl group, a 2-thenoyl group, a methoxycarbonyl group, an ethoxycarbonyl group, an allyloxycarbonyl group, an N-methylcarbamoyl group, an N-phenylcarbamoyl group, an N,N-diethylcarbamoyl group, a morpholinocarbonyl group.

Examples of the compound where $X^1$ and $X^2$ are combined with each other to form a ring include those where a partial structure represented by the following partial structural formula (Ia) is formed.

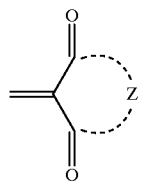

(Ia)

wherein Z represents a nonmetallic atom group necessary for forming a 5-, 6- or 7-membered hydrocarbon or heterocyclic ring which may have a substituent.

Examples of the partial structure represented by partial structural formula (Ia) include those known as an acidic nucleus of merocyanine dyes.

Examples of the partial structure represented by partial structural formula (Ia) are described in detail below.

Examples of the hydrocarbon ring completed by Z include 1,3-cyclopentanediones (e.g., 1,3-cyclopentanedione), 1,3-cyclopentenediones (e.g., 1,3-cyclopentenedione) and 1,3-cyclohexanediones (e.g., 1,3-cyclohexanedione, dimedone, 5-phenyl-1,3-cyclohexanedione).

Other preferred examples of the hydrocarbon ring include indanediones (e.g., 1,3-diketohydrindene) represented by the following partial structural formula (Ia-1):

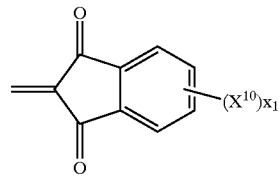

(Ia-1)

wherein $X^{10}$ represents an alkyl group (e.g., same as the example of $R^3$), a substituted alkyl group (e.g., same as the example of $R^3$), an aryl group (e.g., same as the example of $R^3$), a substituted aryl group (e.g., same as the example of $R^3$), an alkoxy group (e.g., methoxy, ethoxy, butoxy), a nitro group, a cyano group, a substituted or unsubstituted amino group (e.g., amino, dimethylamino, diethylamino) or a halogen atom, and $x_1$ represents an integer of from 0 to 4.

Examples of the heterocyclic ring completed by Z include 1-oxa-2,4-cyclopentanediones (e.g., tetronic acid), 1-thia-2,4-cyclopentanediones (e.g., thiotetronic acid) and 1,3-dioxa-4,5-cyclohexanediones (e.g., merodrum acid).

Other preferred examples of the heterocyclic ring include 2,4,6-triketohexahydropyrimidines (e.g., barbituric acids, 2-thiobarbituric acids, 1,3-substitution product thereof) represented by the following partial structural formula (Ia-2):

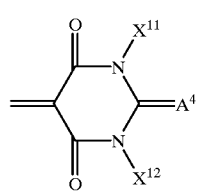

(Ia-2)

wherein $A^4$ represents an oxygen atom or a sulfur atom, $X^{11}$ and $X^{12}$ each independently represents a hydrogen atom, an alkyl group (e.g., same as the example of $R^3$), a substituted alkyl group (e.g., same as the example of $R^3$), an aryl group (e.g., same as the example of $R^3$) or a substituted aryl group (e.g., same as the example of $R^3$);

5,7-dioxo-6,7-dihydro-5-thiazolo[3,2-a]pyrimidines (e.g., 5,7-dioxo-3-phenyl-6,7-dihydro-5-thiazolo[3,2-a]-pyrimidine) represented by the following partial structural formula (Ia-3):

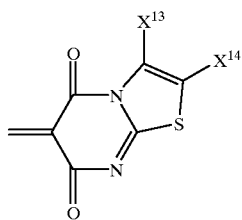

(Ia-3)

wherein $X^{13}$ and $X^{14}$ each independently represents a hydrogen atom, an alkyl group (e.g., same as the example of $R^3$), a substituted alkyl group (e.g., same as the example of $R^3$), an aryl group (e.g., same as the example of $R^3$) or a substituted aryl group (e.g., same as the example of $R^3$);

3,5-pyrazolidinediones (e.g., 1,2-diphenyl-3,5-pyrazolidinedione) represented by the following partial structural formula (Ia-4):

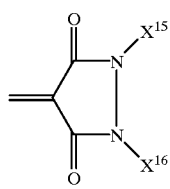

(Ia-4)

wherein $X^{15}$ and $X^{16}$ each independently represents a hydrogen atom, an alkyl group (e.g., same as the example of $R^3$), a substituted alkyl group (e.g., same as the example of $R^3$) an aryl group (e.g., same as the example of $R^3$) or a substituted aryl group (e.g., same as the example of $R^3$);

1,2,3,4-tetrahydro-2,4-quinolinediones (e.g., 1-methyl-1,2,3,4-tetrahydro-2,4-quinolinedione) represented by the following partial structural formula (Ia-5):

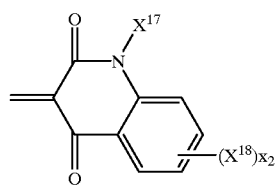

(Ia-5)

wherein $X^{17}$ represents a hydrogen atom, an alkyl group (e.g., same as the example of $R^3$), a substituted alkyl group (e.g., same as the example of $R^3$), an aryl group (e.g., same as the example of $R^3$) or a substituted aryl group (e.g., same as the example of $R^3$), $X^{18}$ represents a substituent the same as $X^{10}$, and $x_2$ represents an integer of from 0 to 4;

2,4-chromandiones (e.g., 2,4-chromandione) represented by the following structural formula (Ia-6):

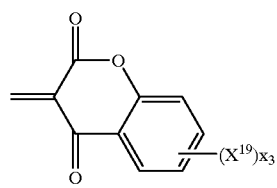

(Ia-6)

wherein $X^{19}$ independently represents a substituent the same as $x^{10}$, $x_3$ represents an integer of from 0 to 4; and 2,4-dioxo-3,4-dihydro-2H-pyrans (e.g., 2,4-dioxo-3,4-dihydro-6-methyl-2H-pyran) represented by the following partial structural formula (Ia-7):

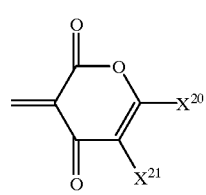

(Ia-7)

wherein $X^{20}$ and $X^{21}$ each independently represents a substituent the same as $X^{10}$.

Among the examples of $x^1$ and $x^2$, preferred are those where the partial structure (Ia) is an indanedione represented by formula (Ia-1) or a 2,4,6-triketohexahydropyrimidine represented by formula (Ia-2), more preferably a 2-thiobarbuturic acid represented by formula (Ia-2).

In formula (I), n is 0, 1 or 2, preferably 1 or 2.

Specific examples of the sensitizing dye represented by formula (I) are set forth below, however, the present invention is by no means limited thereto. In the following, the compounds are shown by the combination of the ring completed by $Q^1$ (indicated by $Q^1$), the carbon divalent group formed by the bonding of $X^1$ and $X^2$, and n, where $R^1$ and $R^2$ each is a hydrogen atom (Nos. 1 to 86).

| Sensitizing Dye No. | $Q^1$ | $X^1, X^2$ (with =CH<) | n |
|---|---|---|---|
| | ($R^1 = R^2 = H$) | | |
| 1 | 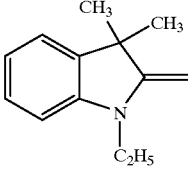 | 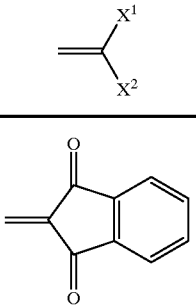 | 1 |
| 2 | 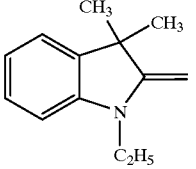 | 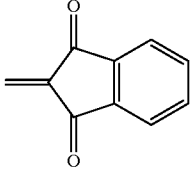 | 2 |
| 3 | 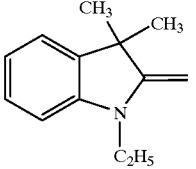 | 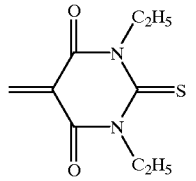 | 1 |
| 4 | 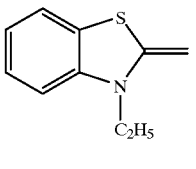 | 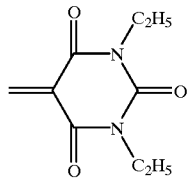 | 1 |
| 5 | 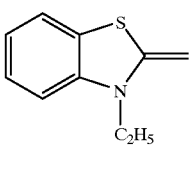 | 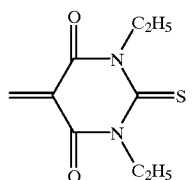 | 1 |
| 6 | 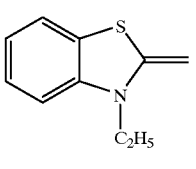 | 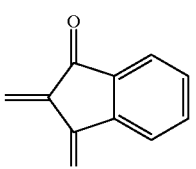 | 1 |
| 7 | 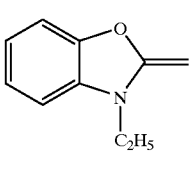 | 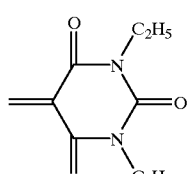 | 1 |

-continued
| 8 | 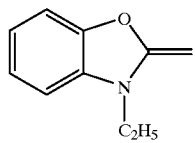 | 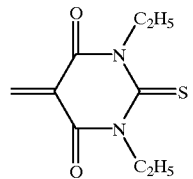 | 1 |
| 9 | 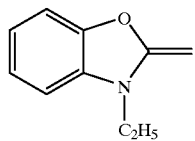 | 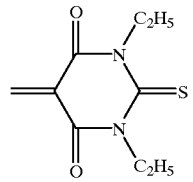 | 2 |
| 10 | 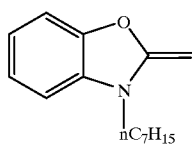 | 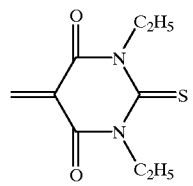 | 1 |
| 11 | 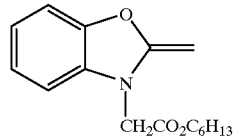 | 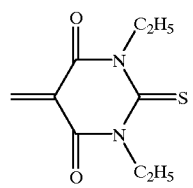 | 1 |
| 12 | 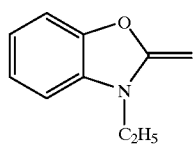 | 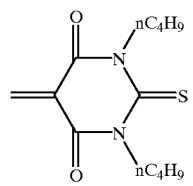 | 1 |
| 13 | 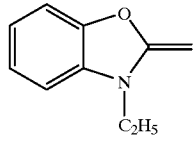 | 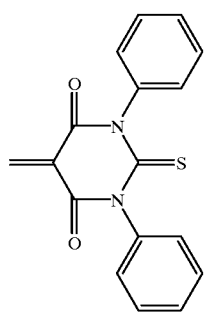 | 1 |
| 14 | 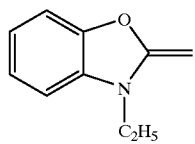 | 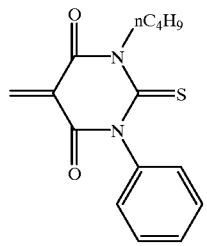 | 1 |

-continued
| | | | |
|---|---|---|---|
| 15 | 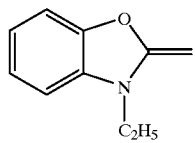 | 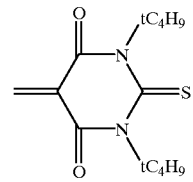 | 1 |
| 16 | 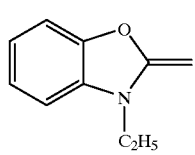 | 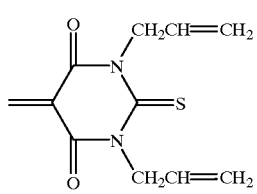 | 1 |
| 17 | 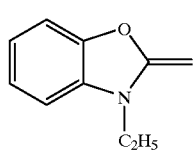 | 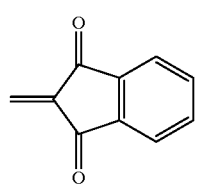 | 1 |
| 18 | 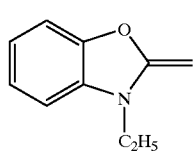 | 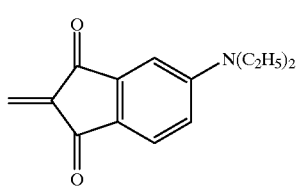 | 1 |
| 19 | 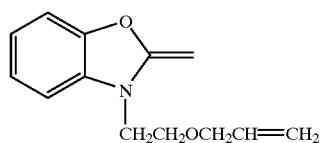 | 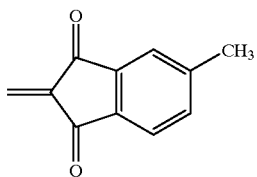 | 1 |
| 20 | 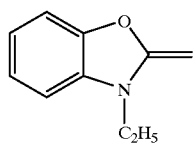 | 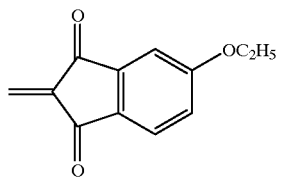 | 1 |
| 21 | 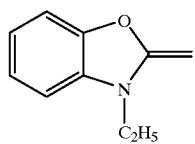 | 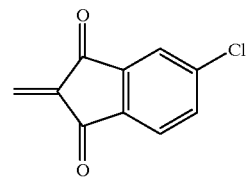 | 1 |
| 22 | 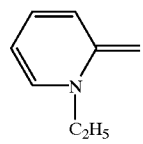 | 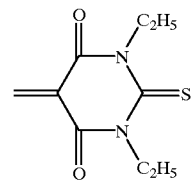 | 1 |

-continued
| | | | |
|---|---|---|---|
| 23 | 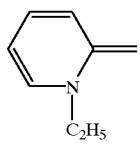 | 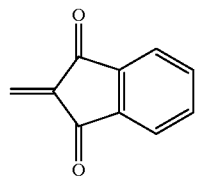 | 1 |
| 24 | 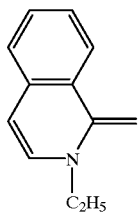 | 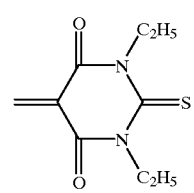 | 1 |
| 25 | 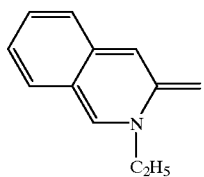 | 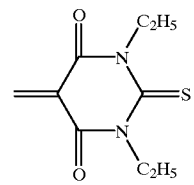 | 1 |
| 26 | 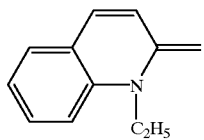 | 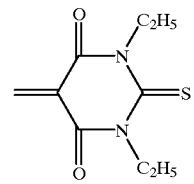 | 1 |
| 27 | 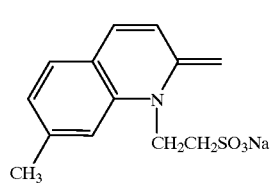 | 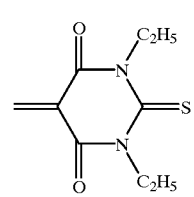 | 1 |
| 28 | 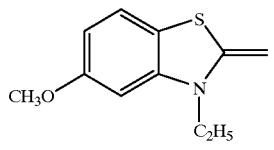 | 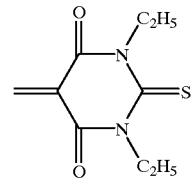 | 1 |
| 29 | 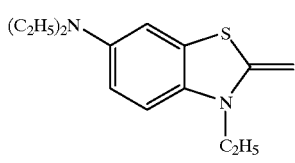 | 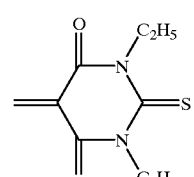 | 1 |
| 30 | 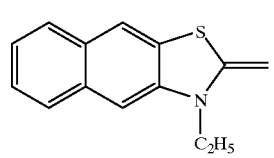 | 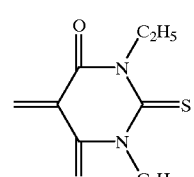 | 1 |

-continued
| 31 | 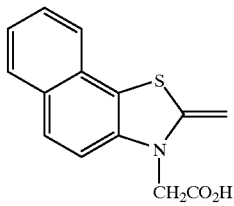 | 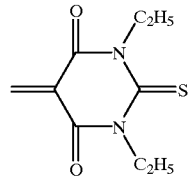 | 1 |
| 32 | 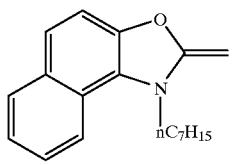 | 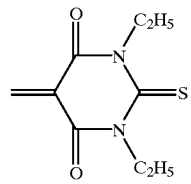 | 1 |
| 33 | 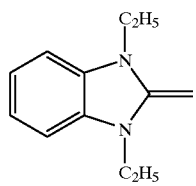 | 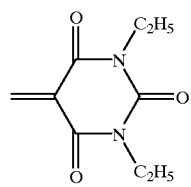 | 1 |
| 34 | 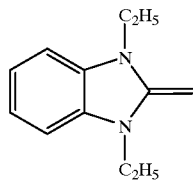 | 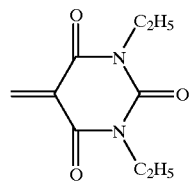 | 2 |
| 35 | 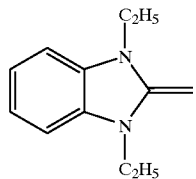 | 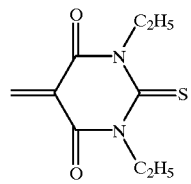 | 1 |
| 36 | 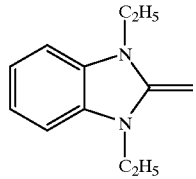 | 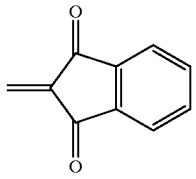 | 1 |
| 37 | 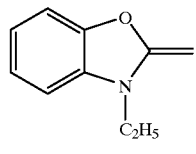 | 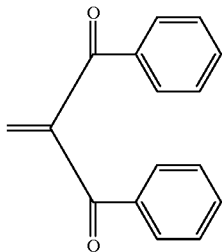 | 1 |

-continued
| | | | |
|---|---|---|---|
| 38 | 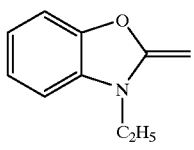 | 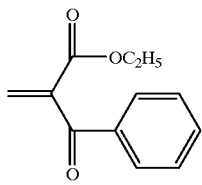 | 1 |
| 39 | 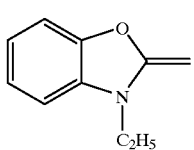 | 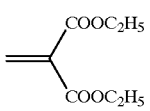 | 1 |
| 40 | 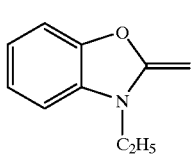 | 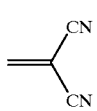 | 1 |
| 41 | 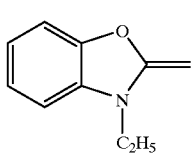 | 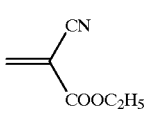 | 1 |
| 42 | 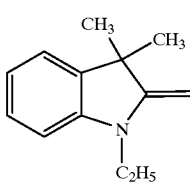 | 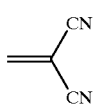 | 1 |
| 43 | 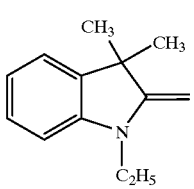 | 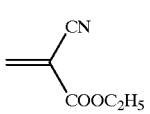 | 1 |
| 44 | 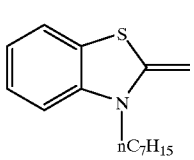 | 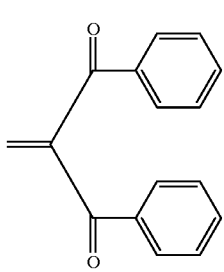 | 1 |
| 45 | 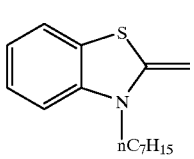 | 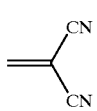 | 2 |

-continued
| | | | |
|---|---|---|---|
| 46 | 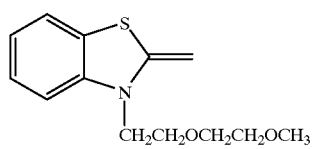 | 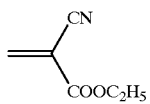 | 1 |
| 47 | 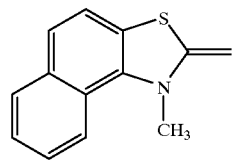 | 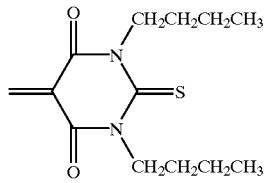 | 0 |
| 48 | 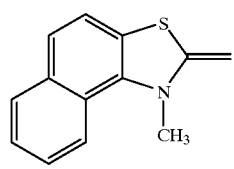 | 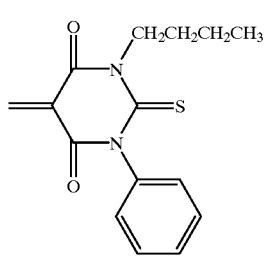 | 0 |
| 49 | 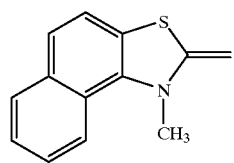 | 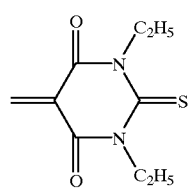 | 0 |
| 50 | 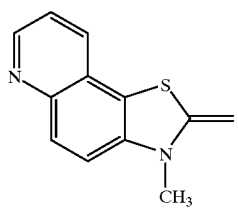 | 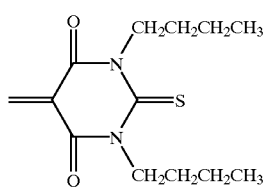 | 0 |
| 51 | 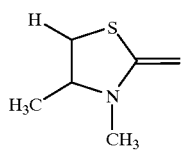 | 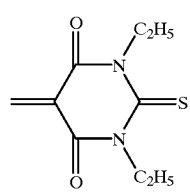 | 0 |
| 52 | 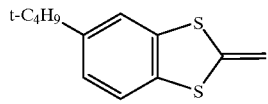 | 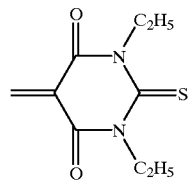 | 1 |

-continued
| | | | |
|---|---|---|---|
| 53 | 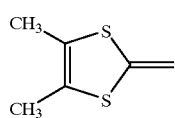 | 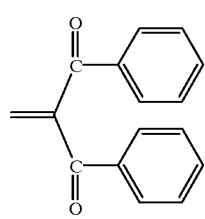 | 0 |
| 54 | 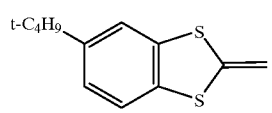 | 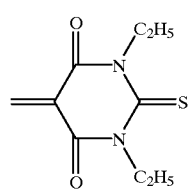 | 0 |
| 55 | 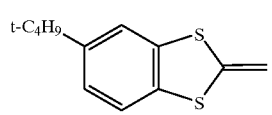 | 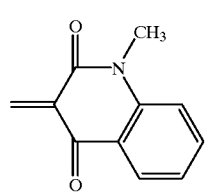 | 0 |
| 56 | 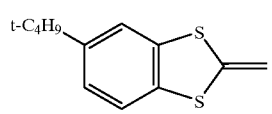 | 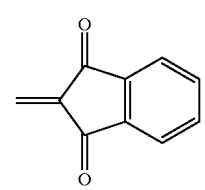 | 0 |
| 57 | 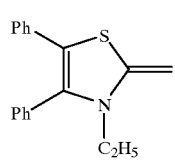 | 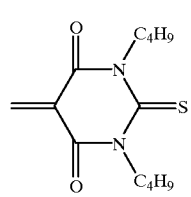 | 1 |
| 58 | 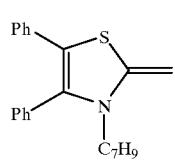 | 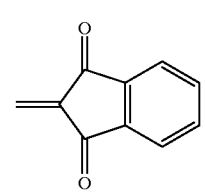 | 1 |
| 59 | 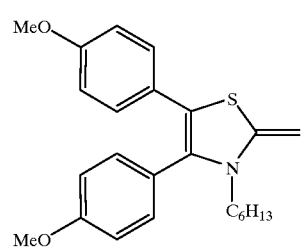 | 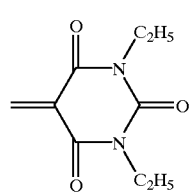 | 1 |

-continued
| | | | |
|---|---|---|---|
| 60 | 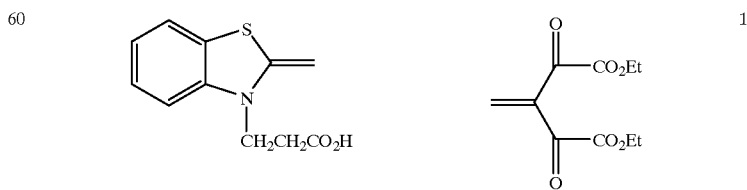 | | 1 |
| 61 | 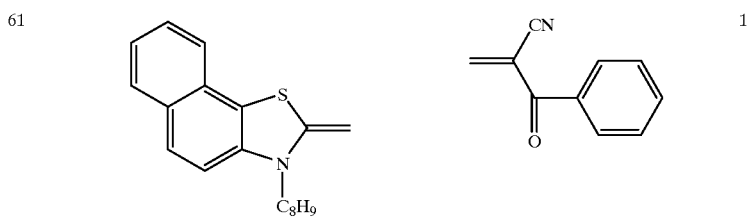 | | 1 |
| 62 | 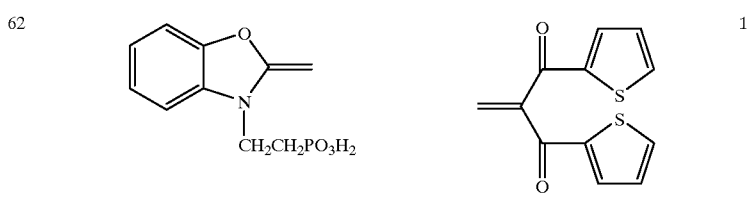 | | 1 |
| 63 | 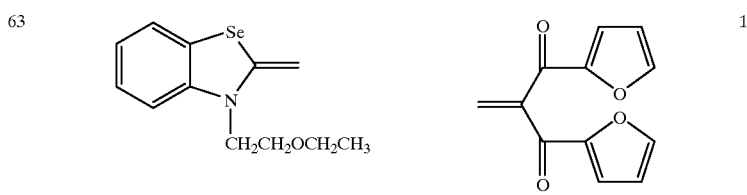 | | 1 |
| 64 | 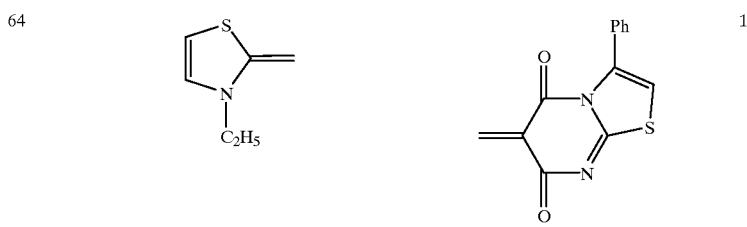 | | 1 |
| 65 | 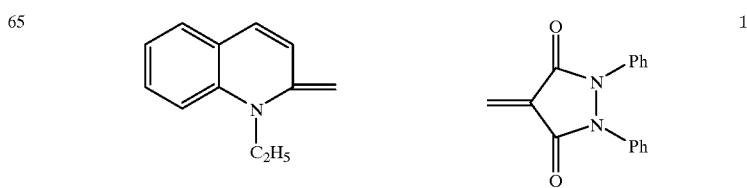 | | 1 |
| 66 | 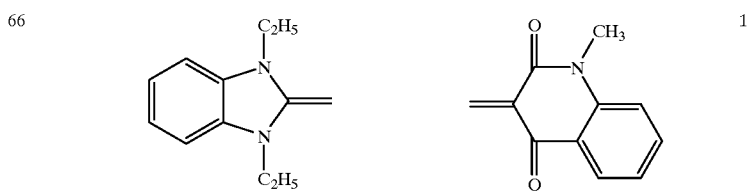 | | 1 |

-continued
| | | | |
|---|---|---|---|
| 67 | 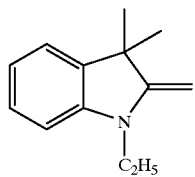 | 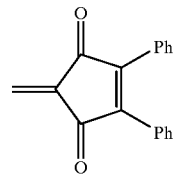 | 1 |
| 68 | 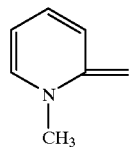 | 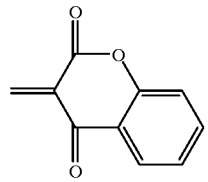 | 1 |
| 69 | 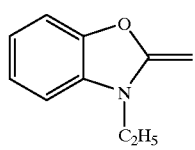 | 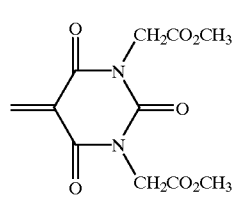 | 1 |
| 70 | 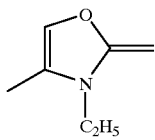 | 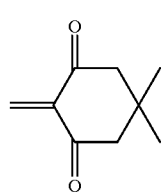 | 1 |
| 71 | 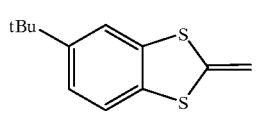 | 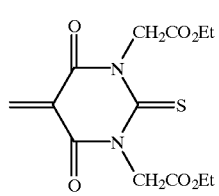 | 1 |
| 72 | 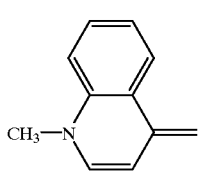 | 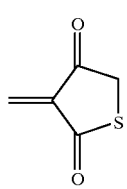 | 1 |
| 73 | 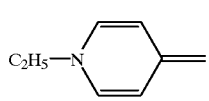 | 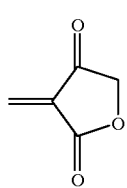 | 1 |
| 74 | 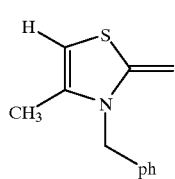 | 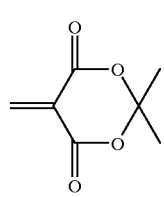 | 1 |

-continued
| | | | |
|---|---|---|---|
| 75 | 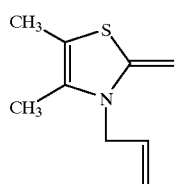 | 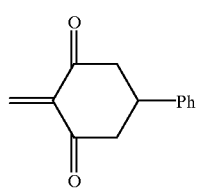 | 1 |
| 76 | 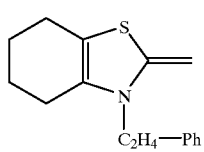 | 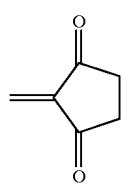 | 1 |
| 77 | 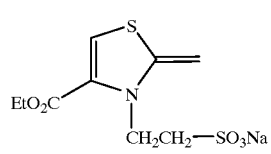 | 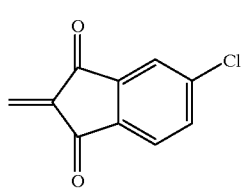 | 1 |
| 78 | 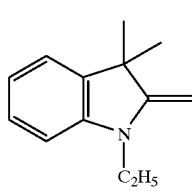 | 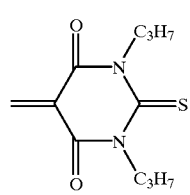 | 1 |
| 79 | 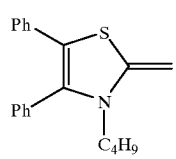 | 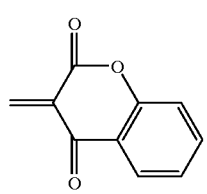 | 1 |
| 80 | 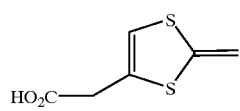 | 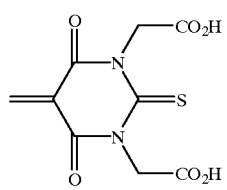 | 1 |
| 81 | 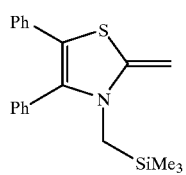 | 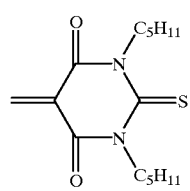 | 1 |

-continued
| | | | |
|---|---|---|---|
| 82 | 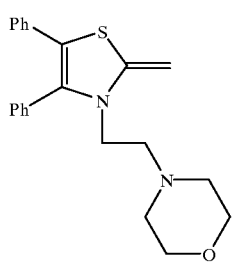 | 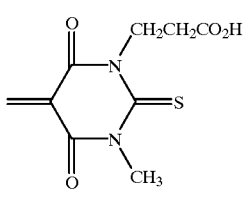 | 1 |
| 83 | 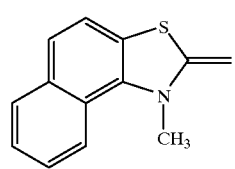 | 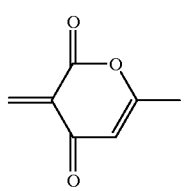 | 1 |
| 84 | 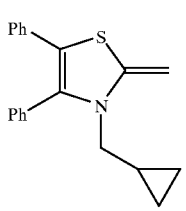 | 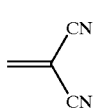 | 1 |
| 85 | 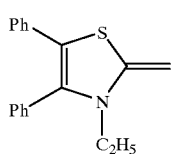 | 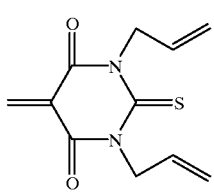 | 1 |
| 86 | 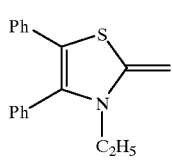 | 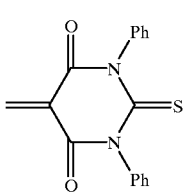 | 1 |
Sensitizing Dye
No. 87
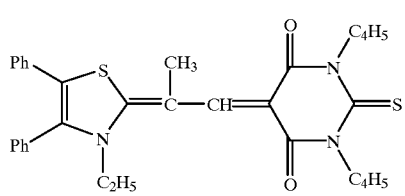
No. 88
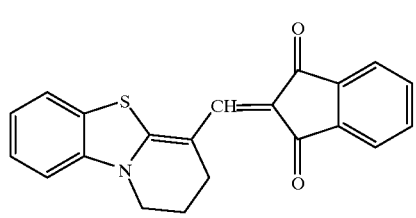

-continued
No. 89 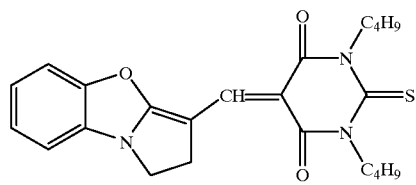
No. 90 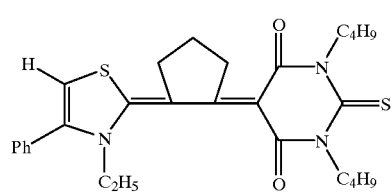
No. 91 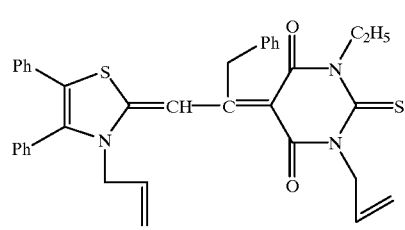
No. 92 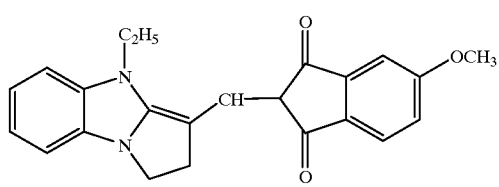
No. 93 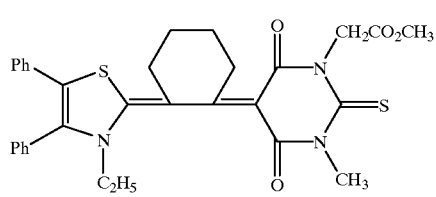
No. 94 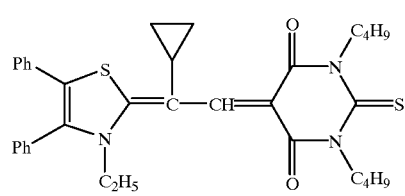
No. 95 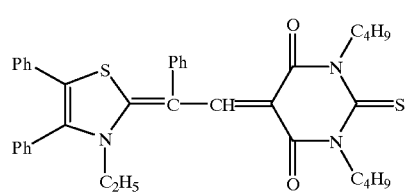

-continued

No. 96

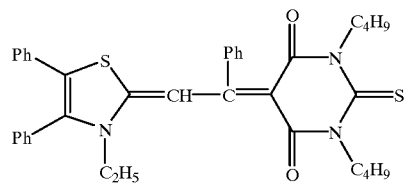

The sensitizing dye represented by formula (I) can be synthesized by referring to the methods described in F. M. Hamer et al, *The Cyanine Dyes and Related Compounds*, pp. 511–611 (1964), and KAI ARNE JENSEN and LARS HENRIKSEN, *ACTA CHEMICA SCANDINAVICA*, Vol. 22, pp. 1107–1128 (1968).

These sensitizing dyes may be used either individually or in combination of two or more thereof. The use amount of the sensitizing dye is from 0.05 to 30 parts by weight, preferably from 0.1 to 20 parts by weight, more preferably from 0.2 to 10 parts by weight, per 100 parts by weight of the compound having an ethylenically unsaturated double bond.

The titanocene compound used as the photopolymerizable initiation system in the present invention may be any if it is a titanocene compound capable of generating active radicals on irradiation of light in the presence of the above-described sensitizing dye and may be appropriately selected from known compounds described, for example, in JP-A-59-152396 and JP-A-61-151197.

More specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl (hereinafter, sometimes referred to as "A-1"), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl (hereinafter, sometimes referred to as "A-2"), dimethylcylopentadienyl-Ti-bis-2,3,5,6-tetrafluorophen-1-yl, dimethylcyclopentadienyl-Ti-bis-2,4-difluorophen-1-yl and bis(cyclopentadienyl)-bis(2,6-difluoro-3-(pyr-1-yl)phenyl)titanium (hereinafter, sometimes referred to as "A-3").

The titanocene compounds for use in the photopolymerizable composition of the present invention may be used individually or in combination of two or more thereof.

The use amount of the titanocene compound is from 0.5 to 100 parts by weight, preferably from 1 to 80 parts by weight, more preferably from 2 to 50 parts by weight, per 100 parts by weight of the compound having an ethylenically unsaturated double bond.

The photopolymerizable composition of the present invention may contain, in addition to the above-described sensitizing dye and titanocene compound, compound (a), (b), (c), (d), (e), (f), (g) or (h), which will be described below, so as to improve sensitivity.

Preferred examples of the compound (a) having a carbon-halogen bond include the following compounds:

a compound represented by the following formula (VI):

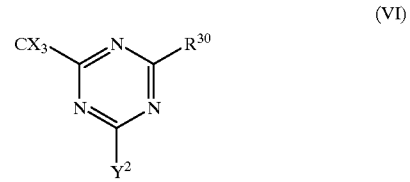

(VI)

wherein X represents a halogen atom, $Y^2$ represents —$CX_3$, —$NH_2$, —$NHR^{31}$, —$NR^{31}_2$ or —$OR^{31}$ (wherein $R^{31}$ represents an alkyl group, a substituted alkyl group, an aryl group or a substituted aryl group), and $R^{30}$ represents —$CX_3$, an alkyl group, a substituted alkyl group, an aryl group, a substituted aryl group or a substituted alkenyl group:

a compound represented by the following formula (VII):

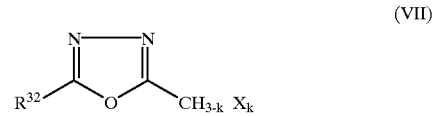

(VII)

wherein $R^{32}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group, X represents a halogen atom, and k represents an integer of from 1 to 3;

a compound represented by the following formula (VIII):

(VIII)

wherein $R^{33}$ represents an aryl group or a substituted aryl group, $R^{34}$ represents —CO—$NR^{35}R^{36}$ (wherein $R^{35}$ and $R^{36}$ each represents an alkyl group, a substituted alkyl group, an alkenyl group, a substituted alkenyl group, an aryl group or a substituted aryl group), an oxadiazolyl group represented by the following formula:

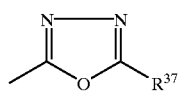

(wherein $R^{37}$ has the same meaning as $R^{32}$ in formula (VII)) or a halogen atom, $Z^3$ represents —CO—, —CS— or —$SO_2$—, and m represents 1 or 2;

a compound represented by the following formula (IX):

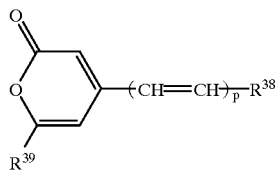

(IX)

wherein $R^{38}$ represents an aryl group or a heterocyclic group, which may be substituted, $R^{39}$ represents a trihaloalkyl or trihaloalkenyl group containing an alkyl or alkenyl group having from 1 to 3 carbon atoms, and p represents 1, 2 or 3;

a carbonylmethylene heterocyclic compound having a trihalogenomethyl group represented by the following formula (X):

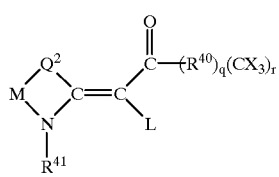

(X)

wherein L represents a hydrogen atom or a substituent represented by the formula: $CO-(R^{40})_q(CX_3)_r$, M represents a substituted or unsubstituted alkylene or arylene group, $Q^2$ represents a sulfur atom, a selenium atom, an oxygen atom, a dialkylmethylene group, an alken-1,2-ylene group, a 1,2-phenylene group or an $N-R^{41}$ group, M and $Q^2$ may be combined to form a 5- or 6-membered ring together with the carbon atom and the nitrogen atom, $R^{40}$ represents a carbocyclic or heterocyclic aromatic group, $R^{41}$ represents an alkyl group, an aralkyl group or an alkoxyalkyl group, X represents a halogen atom such as chlorine, bromine or iodine, and q=0 and r=1 or q=1 and r=1 or 2;

a 4-halogeno-5-(halogenomethylphenyl)oxazole derivative represented by the following formula (XI):

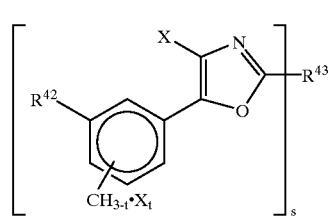

(XI)

wherein X represents a halogen atom, t represents an integer of from 1 to 3, s represents an integer of from 1 to 4, $R^{42}$ represents a hydrogen atom or a $CH_{3-t}X_t$ group, and $R^{43}$ represents an s-valent unsaturated organic group which may be substituted; and a 2-(halogenomethylphenyl)-4-halogenooxazole derivative represented by the following formula (XII):

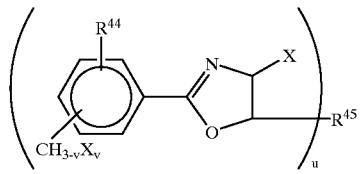

(XII)

wherein X represents a halogen atom, v represents an integer of from 1 to 3, u represents an integer of from 1 to 4, $R^{44}$ represents a hydrogen atom or a $CH_{3-v}X_v$ group, and $R^{45}$ represents a u-valent unsaturated organic group which may be substituted.

Examples of the above-described compounds having a carbon-halogen bond include:

compounds described in Wakabayashi et al, *Bull. Chem. Soc. Japan*, 42, 2924 (1969) such as 2-phenyl-4,6-bis(trichloromethyl)-S-triazine (hereinafter sometimes referred to as "a-90"), 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichlormethyl)-S-triazine;

compounds described in British Patent 1,388,492 such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine;

compounds described in JP-A-53-133428 such as 2-(4-methoxynaphtho-1-yl)-4,6-bistrichloromethyl-S-triazine, 2-(4-ethoxynaphtho-1-yl)-4,6-bistrichloromethyl-S-triazine, 2-[4-(2-ethoxyethyl)naphtho-1-yl]-4,6-bistrichloromethyl-S-triazine, 2-(4,7-dimethoxynaphtho-1-yl]-4,6-bistrichloromethyl-S-triazine and 2-(acenaphtho-5-yl)-4,6-bistrichloromethyl-s-triazine;

compounds described in German Patent 3,337,024 such as the compounds set forth below:

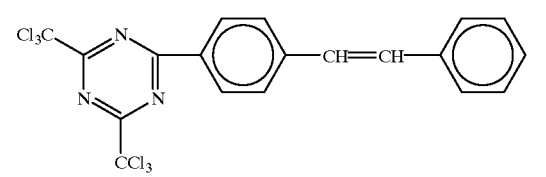

a-1

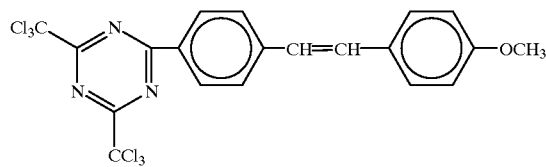

a-2

-continued a-3
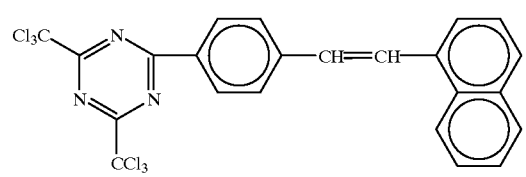

a-4
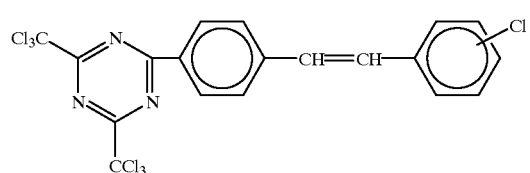

a-5
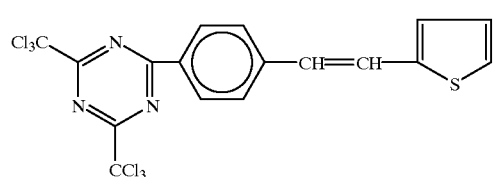

a-6
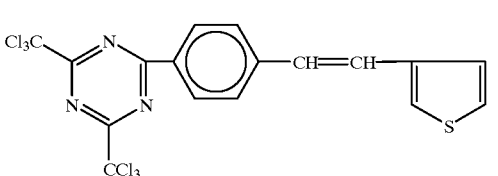

a-7
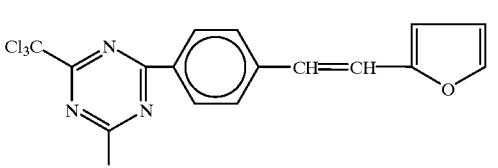

a-8
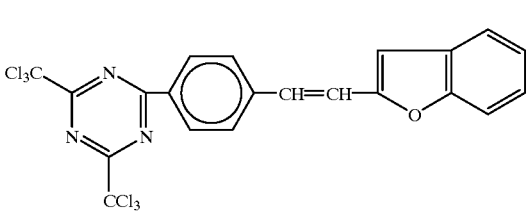

a-9
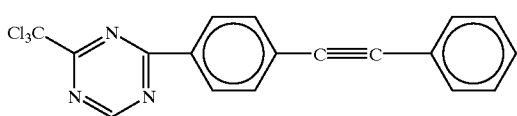

a-10
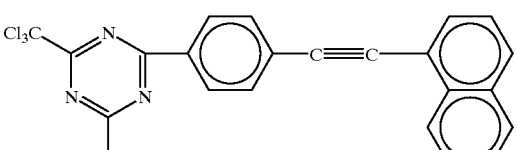

a-11
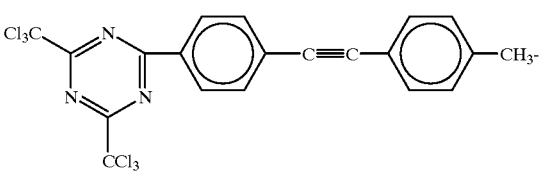

a-12
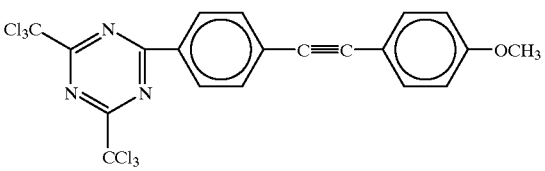

a-13
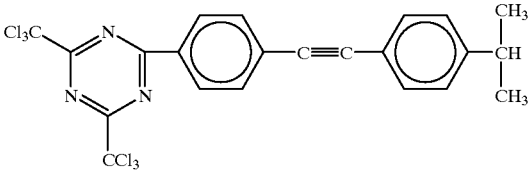

a-14
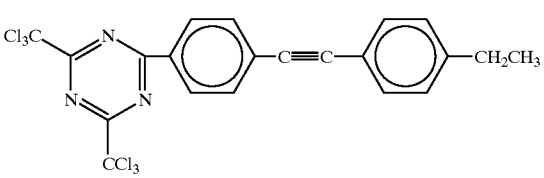

compounds described in F. C. Schaefer et al, *J. Org. Chem.*, 29, 1527 (1964) such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine and 2-methoxy-4-methyl-6-trichloromethyl-S-triazine;

compounds described in JP-A-62-58241 such as the compounds set forth below:

compounds described in JP-A-5-281728 such as the compounds set forth below:

a-15
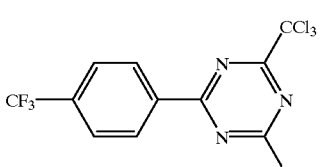

a-16
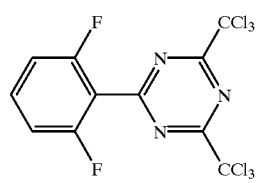
a-17
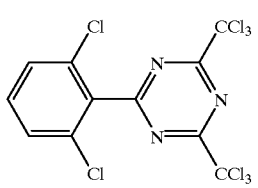
a-18
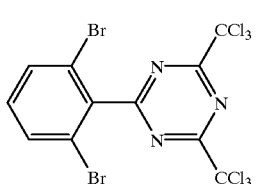
compounds set forth below, which can be easily synthesized by one skilled in the art according to the synthesis method described in M. P. Hutt, E. F. Elslager and L. M. Werbel, *Journal of Heterocyclic Chemistry*, Vol. 7 (No. 3), page 511 et seq (1970):
a-19
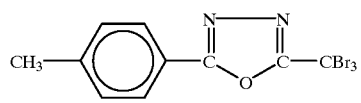
a-20
a-21
a-22
a-23
a-24
a-25
a-26
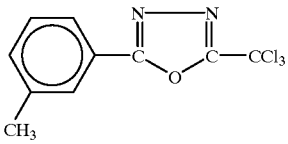
a-27
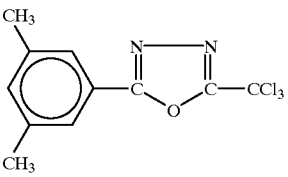
a-28
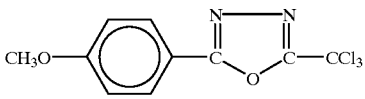
a-29
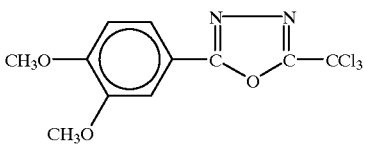
a-30
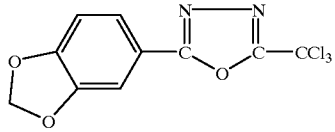
a-31
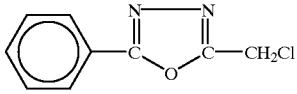
a-32
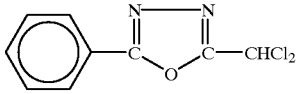
a-33
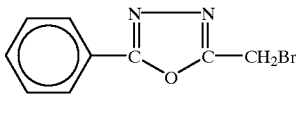
a-34
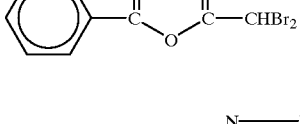
a-35
a-36
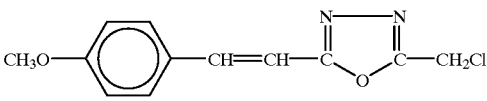
a-37
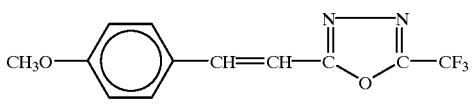

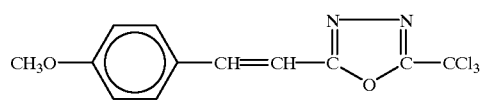
a-38
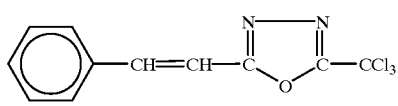
a-39
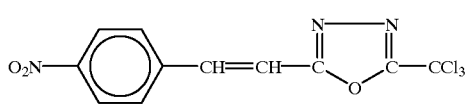
a-40
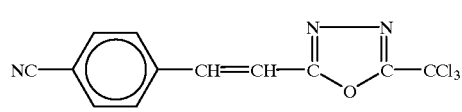
a-41
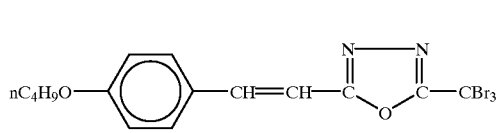
a-42
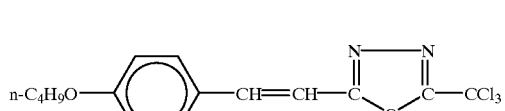
a-43
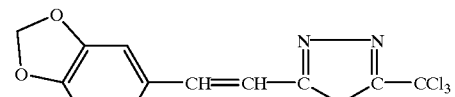
a-44
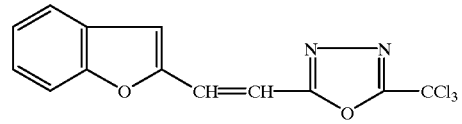
a-45
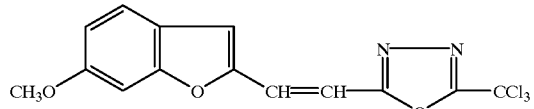
a-46
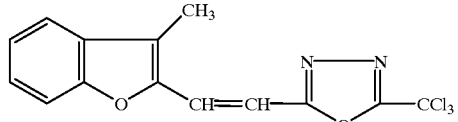
a-47
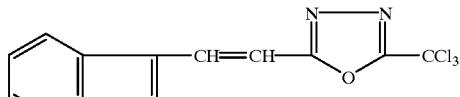
a-48
a-49
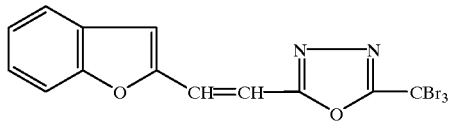
a-50
a-51
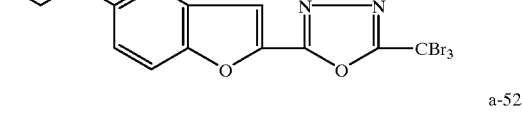
a-52
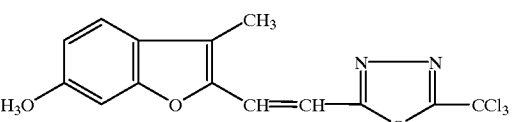
a-53
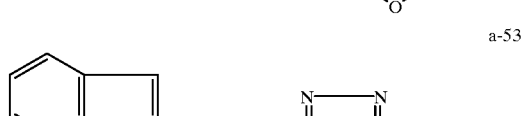
a-54
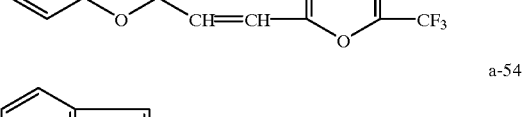
a-55
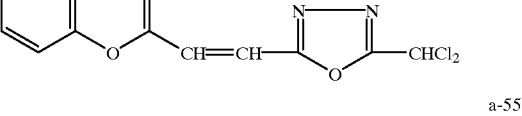
a-56
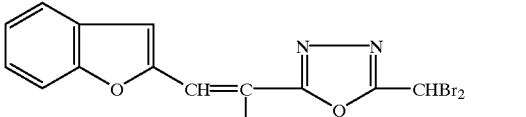
a-57
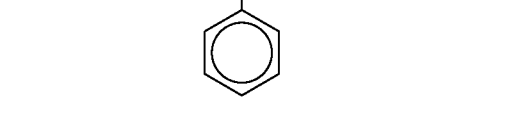
a-58
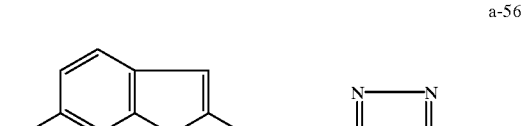
a-59
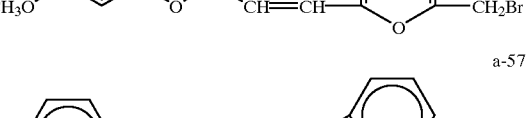
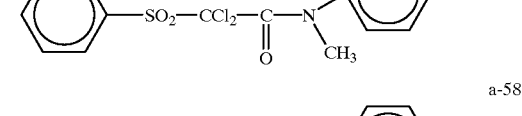
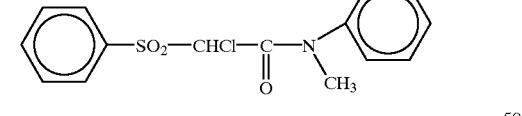

-continued a-60
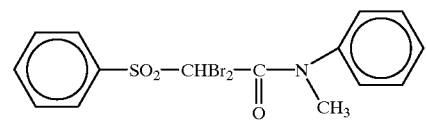

a-61
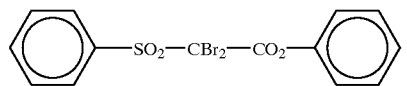

a-62
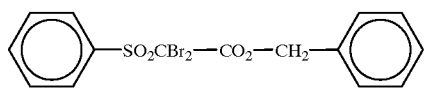

a-63
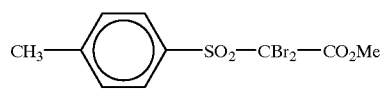

a-64
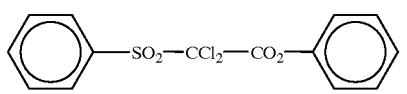

a-65
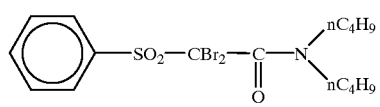

a-66
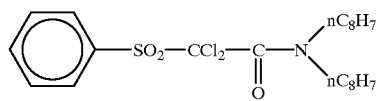

a-67
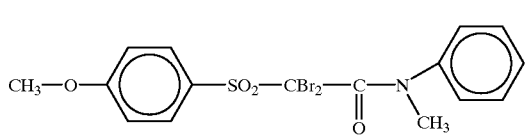

a-68
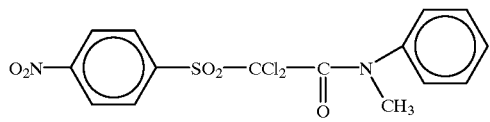

a-69
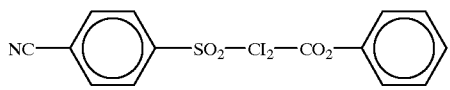

a-70
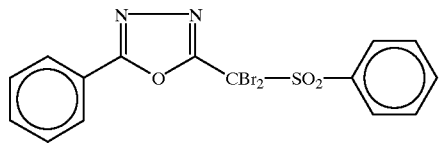

a-71
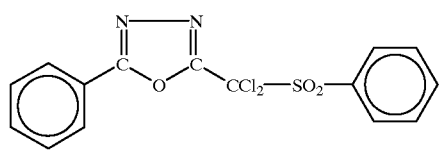

a-72
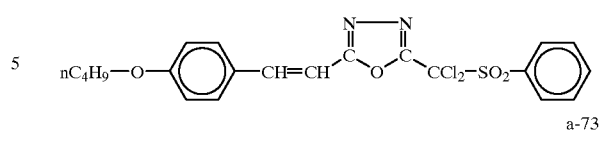

a-73
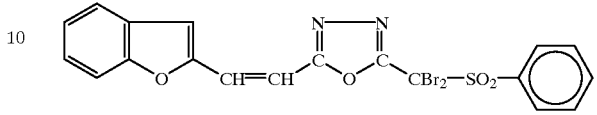

compounds described in German Patent 2,641,100 such as 4-(4-methoxystyryl)-6-(3,3,3-trichloropropenyl)-2-pyrone and 4-(3,4,5-trimethoxystyryl)-6-trichloromethyl-2-pyrone;

compounds described in German Patent 3,333,450 such as the compounds set forth below:

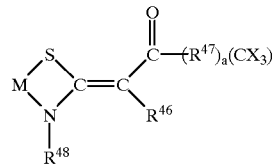

wherein $R^{47}$=a benzene ring, and a=0 or 1.

| | $R^{48}$ | M | $R^{46}$ | a | $CX_3$ |
|---|---|---|---|---|---|
| a-74 | $C_2H_5$ | 1,2-phenylene | H | 1 | 4-$CCl_3$ |
| a-75 | $CH_2C_6H_5$ | 1,2-phenylene | H | 1 | 4-$CCl_3$ |
| a-76 | $C_2H_5$ | 1,2-phenylene | H | 1 | 3-$CCl_3$ |
| a-77 | $C_2H_5$ | 1,2-phenylene | H | 1 | 4-$CF_3$ |
| a-78 | $C_2H_5$ | 5-$CH_3$-1,2-phenylene | H | 0 | $CCl_3$ |
| a-79 | $CH_2C_6H_5$ | 1,2-phenylene | H | 0 | $CCl_3$ |
| a-80 | $C_2H_4OCH_3$ | 1,2-phenylene | H | 1 | 4-$CCl_3$ | compounds described in German Patent 3,021,590 such as the compounds set forth below:

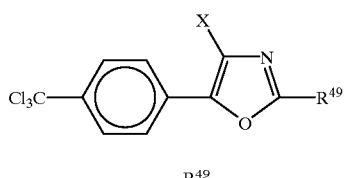

| | $R^{49}$ | X |
|---|---|---|
| a-81 | 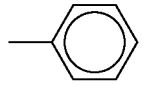 | Cl |
| a-82 |  | Cl |
| a-83 | 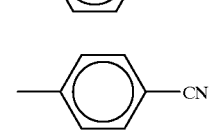 | Cl |

-continued

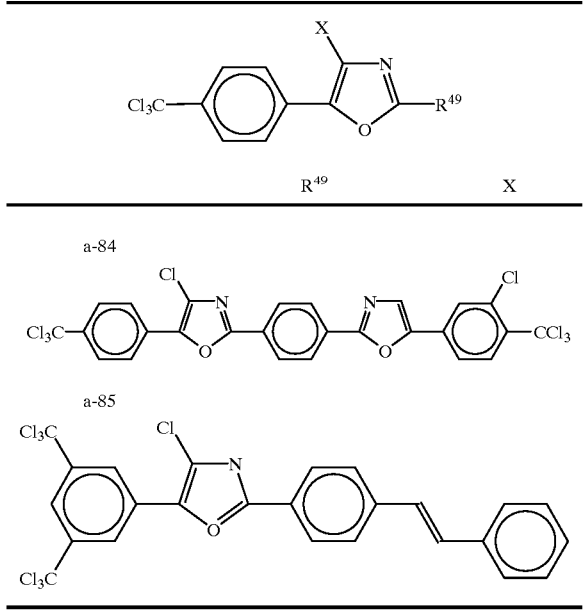

compounds described in German Patent 3,021,599 such as the compounds set forth below:

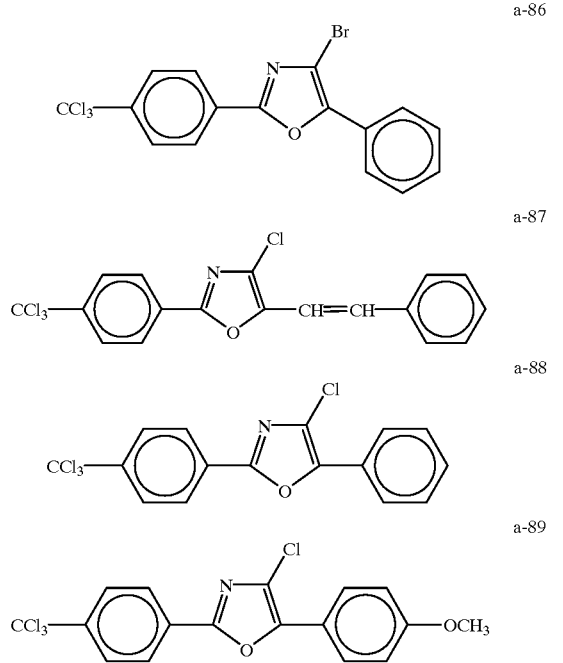

The ketone compound represented by formula (II) as component (b) for use in the present invention is described below. In formula (II), $R^{10}$ and $R^{11}$ each represents a hydrogen atom or an alkyl group having from 1 to 8 carbon atoms, or $R^{10}$ and $R^{11}$ may be combined with each other to form a ring together with the carbon atom, and examples of the ring include cyclohexanone. The ring formed by $R^{10}$, $R^{11}$ and the carbon atom may be a divalent group linking the carbonyl group and the morpholino group, and examples of the divalent group include a p-phenylene group.

Ar is an aromatic group represented by the formula described above, and $R^{12}$, $R^{13}$, $R^{14}$, $R^{15}$ and $R^{16}$ each independently represents a hydrogen atom, a halogen atom, an alkyl group having from 1 to 12 carbon atoms, an alkenyl group having from 3 to 12 carbon atoms, an aryl group, an alkoxy group having from 1 to 12 carbon atoms, a hydroxyl group, $-S-R^{18}$, $-SO-R^{18}$ or $-SO_2-R^{18}$ (wherein $R^{18}$ represents a hydrogen atom, an alkyl group or an alkenyl group).

$R^{17}$ represents a hydrogen atom, an alkyl group having from 1 to 12 carbon atoms or an acyl group having from 2 to 13 carbon atoms.

These alkyl, aryl, alkenyl and acyl groups each may further be substituted by a substituent having from 1 to 6 carbon atoms.

$L^1$ represents a bond or an alkylene group (e.g., ethylene, ethyl-dimethylaminoethylene). When $L^1$ is a bond, at least one of $R^{12}$ to $R^{16}$ is $-S-R^{18}$ or $-SO-R^{18}$.

$Y^1$ represents a hydrogen atom or a substituted carbonyl group represented by the formula described above, and in the formula, $R^{10}$ and $R^{11}$ have the same meanings as defined above.

Specific examples of the ketone compound include the following compounds described in U.S. Pat. No. 4,318,791 and European Unexamined Patent Publication 0284561A:

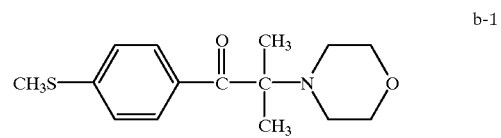

b-1

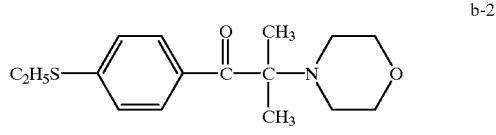

b-2

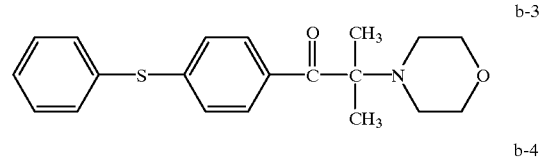

b-3

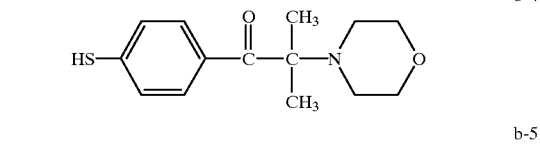

b-4

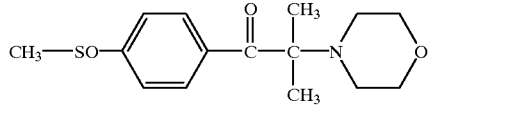

b-5

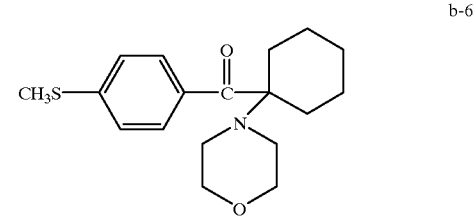

b-6

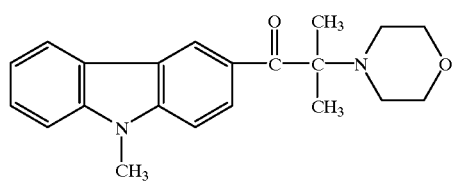
b-7

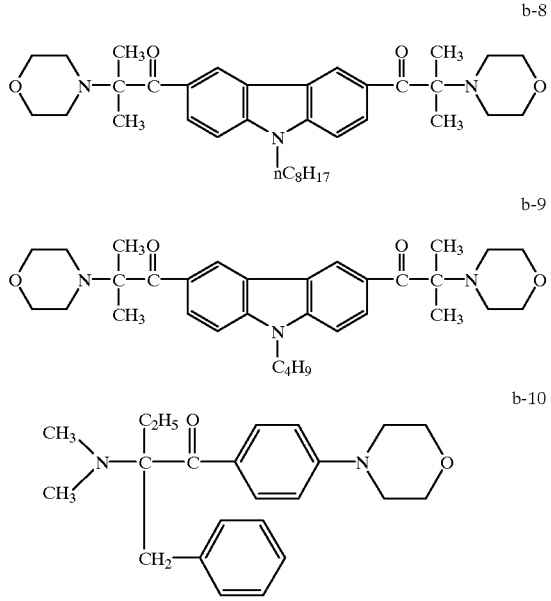
b-8 b-9 b-10

The ketoxime compound represented by formula (III) as component (c) for use in the present invention is described below.

In formula (III), $R^{19}$ and $R^{20}$, which may be the same or different, each represents an aliphatic or aromatic hydrocarbon group which may have a substituent or may contain an unsaturated bond, or a heterocyclic group. Specific examples of $R^{19}$ and $R^{20}$) include an allyl group, a phenylmethyl group, an n-butyl group, an n-dodecyl group, a 2-methoxyethoxyethyl group, a 4-methoxycarbonylphenylmethyl group, a methoxycarbonylmethyl group, an ethoxycarbonylmethyl group, a 4-methoxycarbonylbutyl group, a 2-methoxycarbonylethyl group, a 3-methoxycarbonylallyl group, a benzyloxycarbonylmethyl group, a 4-methoxyphenyl group, a 4-methylthiophenyl group and a 4-morpholinophenyl group.

$R^{21}$ and $R^{22}$, which may be the same or different, each represents a hydrogen atom, an aliphatic or aromatic hydrocarbon group which may have a substituent or may contain an unsaturated bond, a heterocyclic group, a hydroxyl group, a substituted oxy group, a mercapto group or a substituted thio group, and specific examples of $R^{21}$ and $R^{22}$ include a methyl group.

$R^{23}$ and $R^{24}$ each represents a hydrogen atom, an aliphatic or aromatic hydrocarbon group which may have a substituent or may contain an unsaturated bond, or a substituted carbonyl group. Or, $R^{23}$ and $R^{24}$ may be combined with each other to form a ring, and the ring may contain at least one of —O—, —NR$^{23}$—, —O—CO—, —NH—CO—, —S— and —SO$_2$— in the linking main chain and has from 2 to 8 carbon atoms.

Specific examples of $R^{23}$ and $R^{24}$ include a methyl group and specific examples of the ring formed by $R^{23}$ and $R^{24}$ include a morpholine ring.

Specific examples of compound (c) include the following compounds but the present invention is by no means limited thereto.

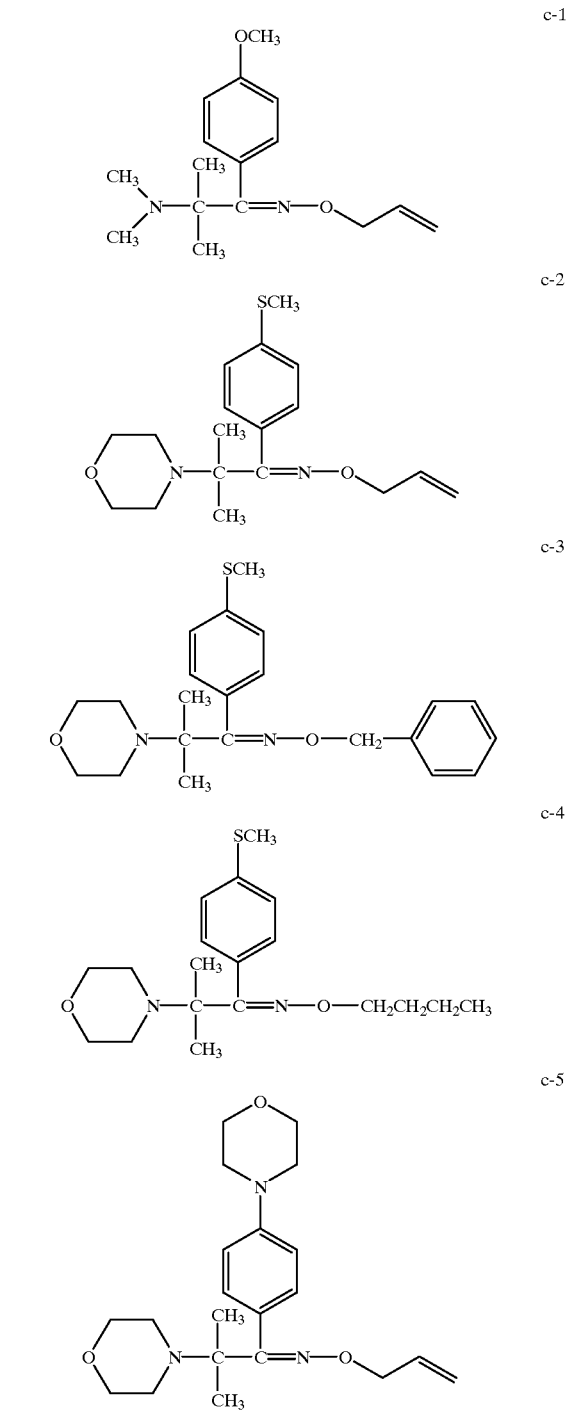

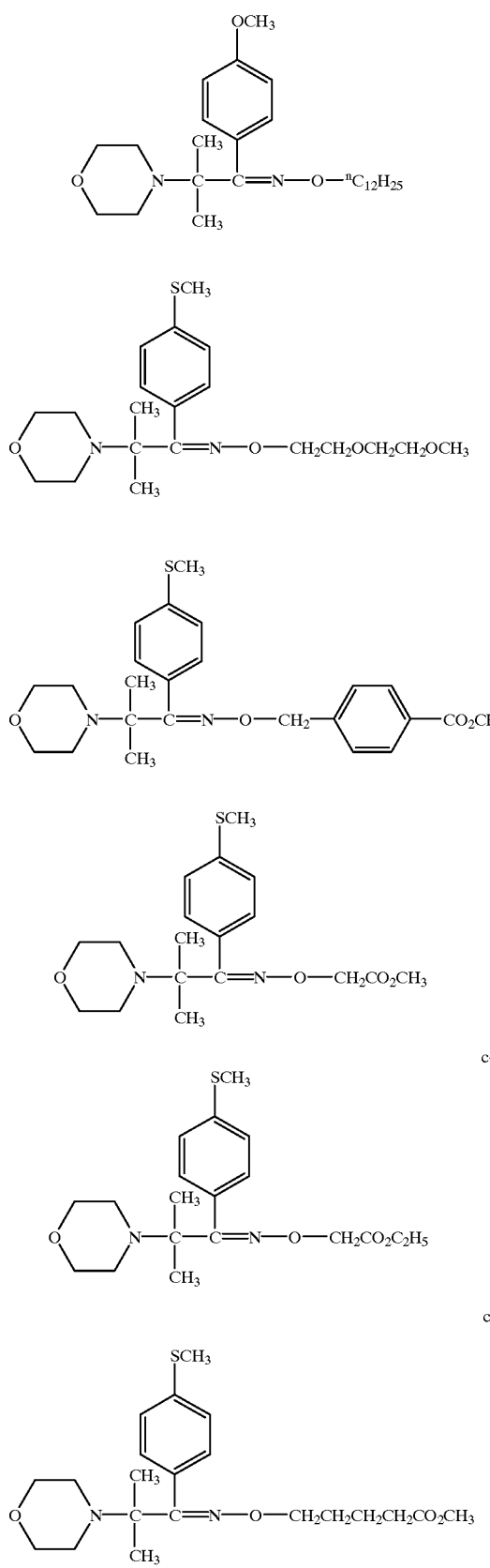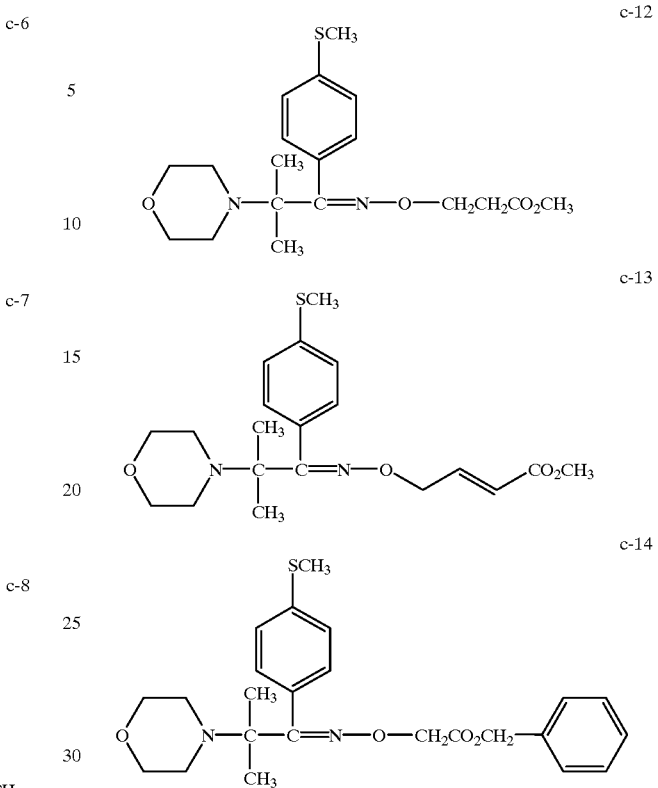

The organic peroxide as component (d) for use in the present invention includes compounds having an oxygen-oxygen bond in the molecule. Examples thereof include methyl ethyl ketone peroxide, cyclohexanone peroxide, 3,3,5-trimethylcyclohexanone peroxide, methylcyclohexanone peroxide, acetylacetone peroxide, 1,1-bis(t-butylperoxy)-3,3,5-trimethylcyclohexane, 1,1-bis(t-butylperoxy) cyclohexane, 2,2-bis(t-butylperoxy)-butane, t-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, bis (t-butylperoxyisopropyl)benzene, 2,5-dimethyl-2,5-di(t-butylperoxy)hexane, 2,5-dimethyl-2,5-di(t-butylperoxy) hexine-3, acetyl peroxide, isobutyryl peroxide, octanoyl peroxide, decanoyl peroxide, lauloyl peroxide, 3,5,5-trimethylhexanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl) peroxydicarbonate, t-butyl peroxyacetate, t-butyl peroxypivalate, t-butyl peroxyneodecanoate, t-butyl peroxyoctanoate, t-butyl peroxy-3,5,5-trimethylhexanoate, t-butyl peroxylaurate, t-butyl peroxybenzoate, di-t-butyl peroxyisophthalate, 2,5-dimethyl-2,5-di(benzoylperoxy) hexane, t-butylperoxymaleate, t-butyl peroxyisopropylcarbonate, 3,3',4,4'-tetra(t-butylperoxycarbonyl)benzophenone, 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra (cumylperoxycarbonyl)benzophenone, 3,3',4,4'-tetra(p- isopropylcumylperoxycarbonyl)benzophenone, carbonyldi(t-butylperoxy dihydrogen diphthalate) and carbonyl-di(t-hexylperoxy dihydrogen diphthalate).

Among these, preferred are peroxide esters such as 3,3',4,4'-tetra(t-butylperoxycarbonyl)benzophenone (hereinafter, sometimes referred to as "d-1"), 3,3',4,4'-tetra(t-amylperoxycarbonyl)benzophenone, 3,3',4,4'-tetra(t-hexylperoxycarbonyl)benzophenone, 3,3',4,4'-tetra(t-octylperoxycarbonyl)benzophenone, 3,3',4,4'-tetra(cumylperoxycarbonyl)-benzophenone, 3,3',4,4'-tetra(p-isopropylcumylperoxycarbonyl)benzophenone and di-t-butyl diperoxyisophthalate.

The thio compound as component (e) for use in the present invention is represented by formula (IV) (described above).

In formula (IV), $R^{25}$ represents an alkyl group or an aryl group and $R^{26}$ represents a hydrogen atom or an alkyl group. The alkyl group represented by $R^{25}$ or R26 is preferably an alkyl group having from 1 to 4 carbon atoms. The aryl group represented by $R^{25}$ is preferably an aryl group having from 6 to 10 carbon atoms, such as phenyl and naphthyl, and the substituted aryl group includes the above-described aryl group substituted by a halogen atom such as chlorine, an alkyl group such as methyl, or an alkoxy group such as methoxy or ethoxy. $R^{25}$ and $R^{26}$ may be combined with each other to form an atomic group necessary for completing a heterocyclic ring which may have a condensed ring, together with the carbon atom and the nitrogen atom. In this case, examples of the condensed ring include a benzene ring.

Specific examples of the thio compound represented by formula (IV) are set forth below. In the following, formula (IV) is again presented and specific examples are shown by the combination of $R^{25}$ or the like in formula (IV).

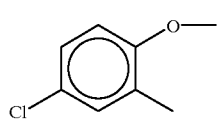

(IV)

| | $R^{25}$ | $R^{26}$ |
|---|---|---|
| e-1 | H | H |
| e-2 | H | CH$_3$ |
| e-3 | CH$_3$ | H |
| e-4 | CH$_3$ | CH$_3$ |
| e-5 | C$_6$H$_5$ | C$_2$H$_5$ |
| e-6 | C$_6$H$_5$ | C$_4$H$_9$ |
| e-7 | C$_6$H$_4$Cl | CH$_3$ |
| e-8 | C$_6$H$_4$Cl | C$_4$H$_9$ |
| e-9 | C$_6$H$_4$—CH$_3$ | C$_4$H$_9$ |
| e-10 | C$_6$H$_4$—OCH$_3$ | CH$_3$ |
| e-11 | C$_6$H$_4$—OCH$_3$ | C$_2$H$_5$ |
| e-12 | C$_6$H$_4$—OC$_2$H$_5$ | CH$_3$ |
| e-13 | C$_6$H$_4$—OC$_2$H$_5$ | C$_2$H$_5$ |
| e-14 | C$_6$H$_4$—OCH$_3$ | C$_4$H$_9$ |
| e-15 | —(CH$_2$)$_3$— | |
| e-16 | —(CH$_2$)$_2$S— | |
| e-17 | —CH(CH$_3$)—CH$_2$—S— | |
| e-18 | —CH$_2$—CH(CH$_3$)—S— | |
| e-19 | —C(CH$_3$)$_2$—CH$_2$—S— | |
| e-20 | —CH$_2$—C(CH$_3$)$_2$—S— | |
| e-21 | —(CH$_2$)$_2$O— | |
| e-22 | —CH(CH$_3$)—CH$_2$—O— | |

-continued

| | $R^{25}$ | $R^{26}$ |
|---|---|---|
| e-23 | —C(CH$_3$)$_2$—CH$_2$—O— | |
| e-24 | —CH=CH—N(CH$_3$)— | |
| e-25 | —(CH$_2$)$_3$S— | |
| e-26 | —(CH$_2$)$_2$CH(CH$_3$)—S— | |
| e-27 | —(CH$_2$)$_3$O— | |
| e-28 | —(CH$_2$)$_5$— | |
| e-29 | —C$_6$C$_4$—O— | |
| e-30 | —N=C(SCH$_3$)—S— | |
| e-31 | —C$_6$H$_4$—NH— | |

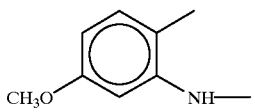
e-32

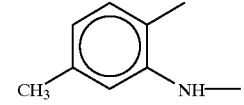
e-33

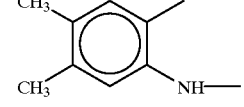
e-34

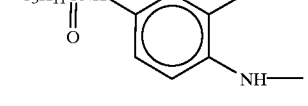
e-35

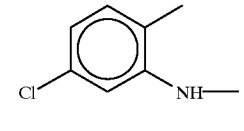
e-36

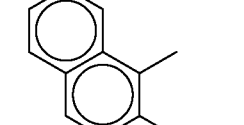
e-37

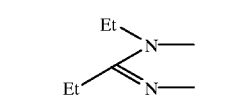
e-38

e-39

-continued

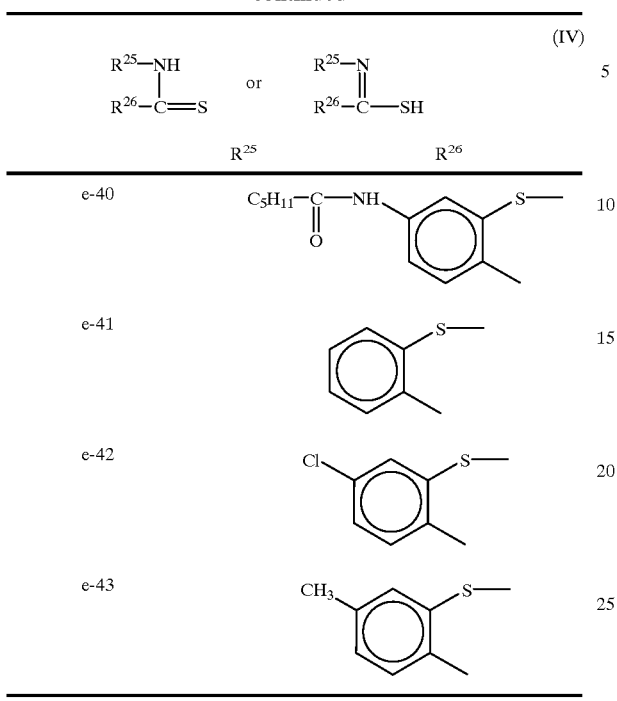

Examples of the hexaarylbiimidazole as component (f) for use in the present invention include 2,2'-bis(o-chlorophenyl)-4,4',5,5'-tetraphenylbiimidazole (hereinafter, sometimes referred to as "f-1"), 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The aromatic onium salt as component (g) for use in the present invention includes aromatic onium salts of elements belonging to Groups 15(5B), 16(6B) and 17(7B) of the Periodic Table, specifically, aromatic onium salts of N, P, As, Sb, Bi, O, S, Se, Te and I. Examples of the aromatic onium salt include the compounds described in JP-B-52-14277, JP-B-52-14278 and JP-B-52-14279. Specific examples thereof are set forth below.

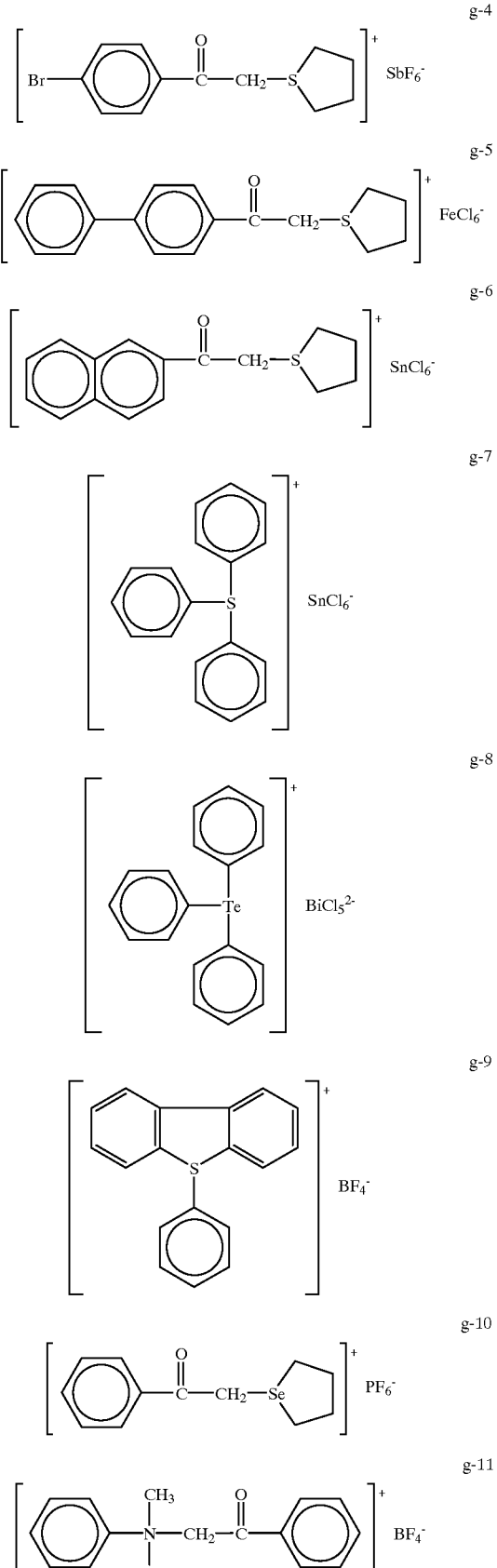

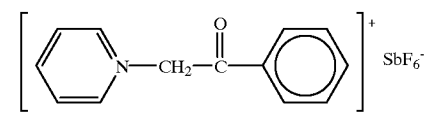 g-12

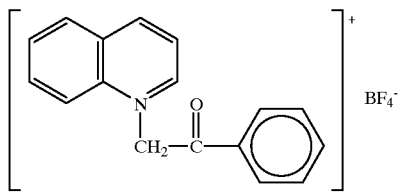 g-13

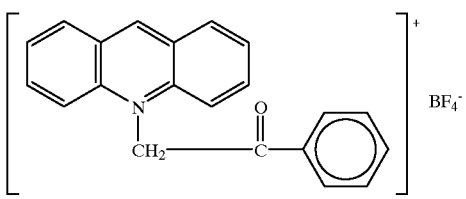 g-14

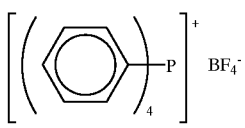 g-15

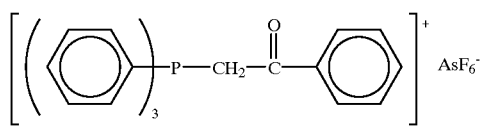 g-16

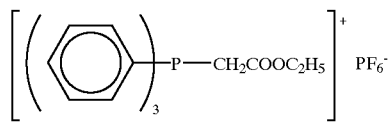 g-17

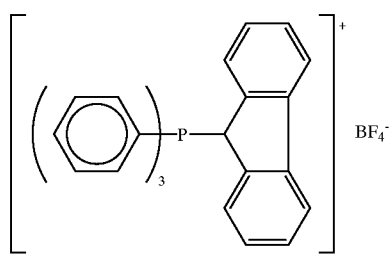 g-18

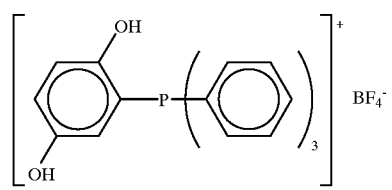 g-19

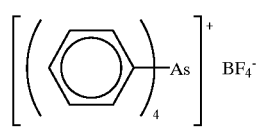 g-20

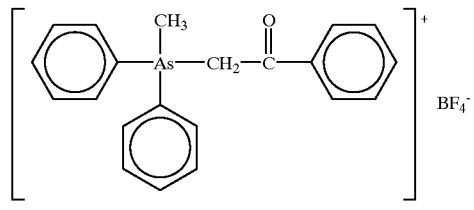 g-21

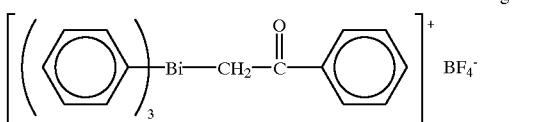 g-22

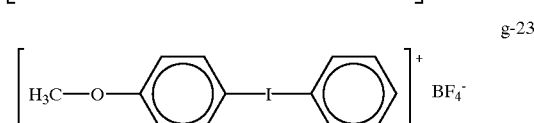 g-23

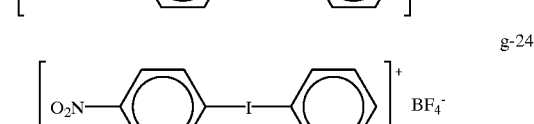 g-24

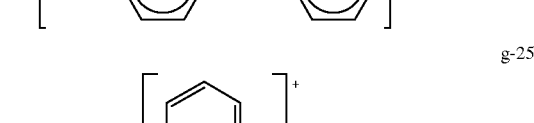 g-25

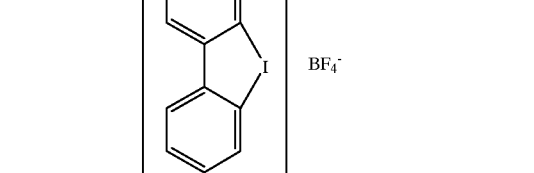 g-25

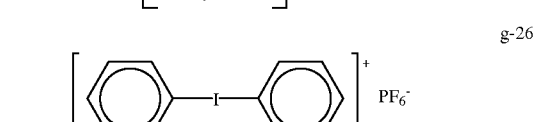 g-26

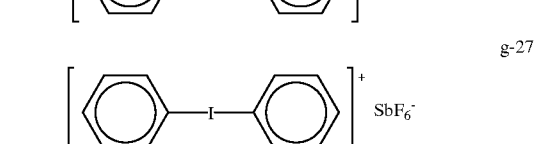 g-27

Among these, preferred are compounds of $BF_4$ salt and $PF_6$ salt, more preferred are a $BF_4$ salt and a $PF_6$ salt of aromatic iodonium salt.

Examples of the ketoxime ester as component (h) for use in the present invention include 3-benzoyloxyiminobutan-2-one (hereinafter, sometimes referred to as "h–1"), 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

These additives (a) to (h) may be used individually or in combination of two or more thereof. The use amount is suitably from 0.05 to 100 parts by weight, preferably from 1 to 80 parts by weight, more preferably from 3 to 50 parts by weight, per 100 parts by weight of the compound having an ethylenically unsaturated double bond.

The composition of the present invention contains the above-described photopolymerization initiation system usually at a very low concentration. If the system is contained at an excessively high concentration, disadvantageous results come out such as cutting of effective light rays. The photopolymerization initiation system of the present invention is preferably used in an amount of from 0.01 to 60 wt %, more preferably, for obtaining further good results, from 1 to 30 wt %, based on the total amount of the photopolymerizable compound having an ethylenically unsaturated double bond and a linear organic high molecular polymer which is added if desired.

The photopolymerizable composition of the present invention preferably contains a linear organic high molecular polymer as a binder. The "linear organic high molecular polymer" may be any compound as long as it is a linear organic high molecular polymer having compatibility with the photo- polymerizable ethylenically unsaturated compound. Preferably, a water- or alkalescent water-soluble or swellable linear organic high molecular polymer which can enable water development or alkalescent water development is selected. The linear organic high molecular polymer is used not only as a film forming agent of the composition but also as a developing agent in a water, alkalescent water or organic solvent developer, and is appropriately selected depending on the use. For example, when a water-soluble organic high molecular polymer is used, water development can be performed. This kind of linear organic high molecular polymer includes an addition polymer having a carboxylic acid group on the side chain and examples thereof include a methacrylic acid copolymer, an acrylic acid copolymer, an itaconic acid copolymer, a crotonic acid copolymer, a maleic acid copolymer and a partially esterified maleic acid copolymer, described in JP-A-59-44615, JP-B-54-34327, JP-B-58-12577, JP-B-54-25957, JP-A-54-92723, JP-A-59-53836 and JP-A-59-71048. Further, an acidic cellulose derivative similarly having a carboxylic acid group on the side chain is included. An addition product of a cyclic acid anhydride to an addition polymer having a hydroxyl group is also useful.

Among these, a [benzyl (meth)acrylate/(meth)acrylic acid/other addition polymerizable vinyl monomer, if desired] copolymer and an [allyl (meth)acrylate/(meth) acrylic acid/other addition polymerizable vinyl monomer, if desired] copolymer are preferred. In addition, polyvinyl pyrrolidone and polyethylene oxide are useful as the water-soluble linear organic polymer. Further, an alcohol-soluble nylon and a polyether of 2,2-bis(4-hydroxyphenyl)propane with epichlorohydrin are also useful so as to increase the strength of the cured film. The above-described linear organic high molecular polymer can be mixed into the entire composition in any arbitrary amount. However, if the mixing amount exceeds 90 wt %, disadvantageous results come out in view of the strength of an image formed or the like. The amount of the liner organic high molecular polymer is preferably from 30 to 85 wt %. The weight ratio of the photopolymerizable compound having an ethylenically unsaturated double bond to the linear organic high molecular polymer is preferably from 1/9 to 7/3, more preferably from 3/7 to 5/5.

In the present invention, other than the above-described fundamental components, a slight amount of a thermal polymerization inhibitor is preferably added so as to prevent unnecessary thermal polymerization of the polymerizable compound having an ethylenically unsaturated double bond during production or storage of the photosensitive composition. Suitable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis (4-methyl-6-t-butylphenol) and N-nitrosophenylhydroxyamine primary cerium salt. The addition amount of the thermal polymerization inhibitor is preferably from about 0.01 to about 5 wt % based on the weight of the entire composition. Also, if desired, a higher fatty acid derivative such as a behenic acid and a behenic acid amide, may be added and rendered to be unevenly present on the surface of the photosensitive layer during the drying process after coating, so that polymerization inhibition due to oxygen can be prevented. The addition amount of the higher fatty acid derivative is preferably from about 0.5 to about 10 wt % of the entire composition.

Further, a dye or a pigment may be added for the purpose of coloring the photosensitive layer. Examples of the coloring agent include a pigment such as a phthalocyanine-based pigment, an azo-based pigment, carbon black and titanium oxide, and a dye such as Ethyl Violet, Crystal Violet, an azo-based dye, an anthraquinone-based dye and a cyanine-based dye. The addition amount of the dye or the pigment is preferably from about 0.5 to about 5 wt % of the entire composition. Also, an inorganic filler or other known additives such as a plasticizer may be added so as to improve physical properties of the cured film.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerine, and when a binder is used, the plasticizer may be added in an amount of 10 wt % or less based on the total weight of the compound having an ethylenically unsaturated double bond and the binder.

The photopolymerizable composition of the present invention is dissolved in various organic solvents and then coated on a support. Examples of the solvent used here include acetone, methyl ethyl ketone, cyclohexane, ethyl acetate, ethylene dichloride, tetrahydrofuran, toluene, ethylene glycol monomethyl ether, ethylene glycol nonoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. These solvents may be used individually or in combination. The solid concentration in the coating solution is suitably from 2 to 50 wt %.

The coverage thereof in terms of the weight after drying is preferably from about 0.1 to about 10 g/m$^2$, more preferably from 0.5 to 5 g/m$^2$.

As the above-described support, a dimensionally stable, plate-like material is used. Examples of the dimensionally stable, plate-like material include paper, paper laminated with plastics (e.g., polyethylene, polypropylene, polystyrene), sheet of a metal such as aluminum (including aluminum alloy), zinc and copper, a plastic film such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal, and paper or plastic film laminated with or having evaporated thereon the above-described metal. Among these supports, an aluminum plate is particularly preferred because it is dimensionally stable to an extreme extent and in addition, cheap. Also, a composite sheet obtained by bonding an aluminum sheet on a polyethylene terephthalate film as described in JP-B-48-18327 is preferred.

A support having a metal, particularly aluminum surface is preferably subjected to surface treatment such as graining treatment, dipping treatment in an aqueous solution of sodium silicate, potassium fluorozirconate or phosphate, or anodic oxidation treatment.

An aluminum plate subjected to graining and then to dipping treatment in an aqueous solution of sodium silicate may be preferably used. Further, an aluminum plate subjected to anodic oxidation treatment and then to dipping treatment in an aqueous solution of alkali metal silicate as described in JP-B-47-5125 can be suitably used. The above-described anodic oxidation treatment is performed by applying current using the aluminum plate as an anode in an electrolytic solution comprising an aqueous or non-aqueous solution of, for example, an inorganic acid such as phosphoric acid, chromic acid, sulfuric acid or boric acid, an organic acid such as oxalic acid or sulfamic acid, or a salt thereof, which solutions may be used individually or in combination of two or more thereof.

The silicate electrodeposition as described in U.S. Pat. No. 3,658,662 is also effective.

Further, the surface treatment comprising a combination of the above-described anodic oxidation treatment and sodium silicate treatment with a support subjected to electrolysis graining as disclosed in JP-B-46-27481, JP-A-52-58602 and JP-A-52-30503 is also effective.

Furthermore, the surface treatment comprising in sequence mechanical graining, chemical etching, electrolysis graining, anodic oxidation treatment and sodium silicate treatment as disclosed in JP-A-56-28893 is also preferred.

The support subjected to the above-described treatments may be suitably subjected to undercoating with a water-soluble resin such as a polymer or copolymer having a polyvinyl phosphonic acid or sulfonic acid group on the side chain, a polyacrylic acid, a water-soluble metal salt (e.g., zinc borate), a yellow dye or an amine salt.

Further, a sol-gel treated substrate having covalent-bonded thereto a functional group capable of addition reaction by radicals described in Japanese Patent Application No. 5-304358 may also be used suitably.

The above-described treatments to achieve hydrophilicity are effected not only to render the support surface hydrophilic but also to prevent harmful reaction of the photopolymerizable composition coated on the support and at the same time, to improve the adhesion property of the photosensitive layer.

In order to prevent polymerization inhibition action of the oxygen in air, a protective layer comprising a polymer having an excellent oxygen cutting property, such as polyvinyl alcohol, in particular, polyvinyl alcohol having a saponification degree of 99% or more, or an acidic cellulose, may be provided on the photopolymerizable composition layer on the support. The coating method of the protective layer is described in detail, for example, in U.S. Pat. No. 3,458,311 and JP-A-55-49729.

The photopolymerizable composition of the present invention can be used in usual photopolymerization. Further, the composition can be applied to various fields, for example, as a photoresist in manufacturing a printing plate or a printed board. In particular, since the photopolymerizable composition of the present invention has high sensitivity and wide spectral sensitivity extending even to a visible light region, good effects can be provided when it is applied to a photosensitive material for a visible light laser such as an $Ar^+$ laser or a YAG-SHG laser.

The photosensitive material using the photopolymerizable composition of the present invention is subjected to image-wise exposure and then the unexposed area of the photosensitive layer is removed by a developer to obtain an image. When the above-described photopolymerizable composition is used in manufacturing a lithographic printing plate, the developer as described in JP-B-57-7427 is preferably used and preferred are an aqueous solution of an inorganic alkali agent such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia, and an aqueous solution of an organic alkali agent such as monoethanolamine or diethanolamine. The alkali solution has a concentration of from 0.1 to 10 wt %, preferably from 0.5 to 5 wt % of the alkali agent.

The above-described alkaline aqueous solution may contain, if desired, a surface active agent or an organic solvent such as benzyl alcohol, 2-phenoxyethanol or 2-butoxyethanol, in a small amount. Examples thereof include those described in U.S. Pat. Nos. 3,375,171 and 3,615,480.

Further, the developers described in JP-A-50-26601, JP-A-58-54341, JP-B-56-39464 and JP-B-56-42860 are also excellent.

Actinic light rays over a wide region of from ultraviolet light to visible light may be used in the present invention, and the light source which can be used includes an ultrahigh-pressure mercury lamp, a high-pressure mercury lamp, a medium-pressure mercury lamp, a low-pressure mercury lamp, a chemical lamp, a carbon arc lamp, a xenon lamp, a metal halide lamp, various laser lamps such as visible and ultraviolet laser lamps, a fluorescent lamp, a tungsten lamp and sunlight.

The present invention will be described below in greater detail by referring to the examples, but the present invention should not be construed as being limited to these examples.

EXAMPLE 1

A 0.3 mm-thick aluminum plate was dipped in a 10 wt % sodium hydroxide at 60° C. for 25 seconds to effect etching, and the plate was washed with flowing water, neutralization-washed with a 20 wt % nitric acid and then washed with water. The resulting plate was subjected to electrolysis graining treatment using a sine wave alternating current in a 1 wt % aqueous nitric acid solution at an anode electricity quantity of 300 coulomb/$dm^2$. Subsequently, the plate was dipped in a 1 wt % aqueous sodium hydroxide solution at 40° C. for 5 seconds and then dipped in a 30 wt % aqueous sulfuric acid solution to effect desmutting at 60° C. for 40 seconds. Thereafter, the plate was subjected to anodic oxidation treatment in a 20 wt % aqueous sulfuric acid solution at a current density of 2 A/$dm^2$ for 2 minutes to form an oxide film having a thickness of 2.7 g/$m^2$ on anode. The surface roughness measured was 0.3 µm (Ra indication according to JIS B0601).

On the back surface of the substrate treated as above, the following sol-gel reaction solution was coated by means of a bar coater and dried at 100° C. for 1 minute to prepare a support having thereon a backcoat layer having a coated amount of 70 mg/$M^2$ after drying.

Sol-Gel Reaction Solution

| | |
|---|---|
| Tetraethyl silicate | 50 parts by weight |
| Water | 20 parts by weight |
| Methanol | 15 parts by weight |
| Phosphoric acid | 0.05 part by weight |

The above-described components were mixed and stirred and after about 5 minutes, generation of heat started. After reacting the mixture for 60 minutes, the following solution was added to prepare a backcoat coating solution.

| | |
|---|---|
| Pyrogallolformaldehyde condensed resin (molecular weight: 2,000) | 4 parts by weight |
| Dimethyl phthalate | 5 parts by weight |
| Fluorine-based surface active agent (N-butylperfluorooctane sulfonamidoethyl acrylate/ polyoxyethylene acrylate copolymer; molecular weight: 20,000) | 0.7 part by weight |
| Methanol silica sol (produced by Nissan Chemical KK; methanol: 30 wt %) | 50 parts by weight |
| Methanol | 800 parts by weight |

On the thus treated aluminum plate, a photopolymerizable composition having the following composition was coated so as to have a dry coated amount of 1.4 g/m² and dried at 80° C. for 2 minutes to form a photosensitive layer.

| | |
|---|---|
| Pentaerythritol tetraacrylate | 1.5 g |
| Allyl methacrylate/methacrylic acid copolymer (copolymerization molar ratio: 80/20) | 2.0 g |

Photopolymerization initiation system (Table 1)

Sensitizing dye

Titanocene compound

Compound of (a) to (h)

| | |
|---|---|
| Fluorine-based nonionic surface active agent (F-177P) | 0.03 g |
| Thermal polymerization inhibitor: N-nitrosophenylhydroxylamine aluminum salt | 0.01 g |
| Pigment dispersion | 2.0 g |
| Composition of pigment dispersion: | |
| Composition | |
| Pigment Blue 15:6 | 30 parts by weight |

-continued

| | |
|---|---|
| Allyl methacrylate/ methacrylic acid copolymner (copolymerization molar ratio: 83/17) | 20 parts by weight |
| Cyclohexanone | 35 parts by weight |
| Methoxypropyl acetate | 35 parts by weight |
| Propylene glycol monomethyl ether | 80 parts by weight |
| Methyl ethyl ketone | 20 g |
| Propylene glycol monomethyl ether | 20 g |

On the thus-formed photosensitive layer, a 3 wt % aqueous solution of polyvinyl alcohol (saponification degree: 98 mol%, polymerization degree: 550) was coated so as to have a dry coated weight of 2 g/m² and dried at 100° C. for 2 minutes.

In this way, Photosensitive Material Nos. 1 to 36 (Table 1) using the photopolymerizable compositions of the present invention were prepared.

Photopolymerizable compositions were obtained in the same manner as the photopolymerizable compositions prepared above except for changing the sensitizing dye, the titanocene compound and the compound of (a) to (h) as shown in Table 2, and using each of these photopolymerizable compositions, Photosensitive Material Nos. 50 to 62 for comparison were prepared in the same manner as above.

Onto each of the thus-prepared photosensitive materials, a Fuji PS step guide (gray scale discontinuously varied in the transmission density by ΔD=0.15) manufactured by Fuji Photo Film Co., Ltd. was adhered, and exposure was applied thereon.

The light source used was a xenon lamp and the light was irradiated through Kenko Optical Filter BP-49 at 0.0132 mW/cm² for 80 seconds.

Each exposed photosensitive material was heated at 120° C. for 20 seconds and then developed. The sensitivity was determined on the photosensitive materials immediately after the preparation and shown by the clear step number of the PS step guide after the development. The larger the step number is, the higher the sensitivity is. The development was performed by dipping each photosensitive material in the following developer under conditions of 25° C. for 10 seconds.

DP-4 66.5 g (produced by Fuji Photo Film Co., Ltd.)

Water 881.4 g

Lipomin LA (20 wt % aqueous solution) 52.1 g

The results obtained are shown in Tables 1 and 2. Alcohol-soluble Eosine $E_o$-1 as a comparative sensitizing dye is shown below. Further, structural formulae of Compounds a-90, d-1, e-34, e-41, f-1 and h-1 of (a) to (h) are also shown below.

TABLE 1

| Photosensitive Material No. | Sensitizing Dye (addition amount: g) | Titanocene Compound (addition amount: g) | Compound of (a) to (h) (addition amount: g) | Step Number (clear) of Gray Scale |
|---|---|---|---|---|
| 1 (Invention) | No. 3 (0.05) | A-3 (0.1) | — | 8 |
| 2 (Invention) | No. 5 (0.05) | A-3 (0.1) | — | 8 |
| 3 (Invention) | No. 7 (0.05) | A-3 (0.1) | — | 8 |
| 4 (Invention) | No. 8 (0.05) | A-3 (0.1) | — | 9 |
| 5 (Invention) | No. 28 (0.05) | A-3 (0.1) | — | 8.5 |
| 6 (Invention) | No. 37 (0.05) | A-3 (0.1) | — | 8 |
| 7 (Invention) | No. 45 (0.05) | A-3 (0.1) | — | 8 |
| 8 (Invention) | No. 3 (0.05) | A-2 (0.1) | — | 8 |
| 9 (Invention) | No. 7 (0.05) | A-2 (0.1) | — | 8 |
| 10 (Invention) | No. 8 (0.05) | A-2 (0.1) | — | 9 |
| 11 (Invention) | No. 3 (0.05) | A-1 (0.1) | — | 8 |
| 12 (Invention) | No. 7 (0.05) | A-1 (0.1) | — | 8 |
| 13 (Invention) | No. 8 (0.05) | A-1 (0.1) | — | 9 |
| 14 (Invention) | No. 8 (0.05) | A-3 (0.1) | a-15 [0.1] | 10 |
| 15 (Invention) | No. 8 (0.1) | A-3 (0.15) | a-90 [0.1] | 10 |
| 16 (Invention) | No. 8 (0.08) | A-3 (0.2) | a-33 [0.2] | 10 |
| 17 (Invention) | No. 8 (0.05) | A-3 (0.1) | b-1 [0.2] | 11 |
| 18 (Invention) | No. 8 (0.05) | A-3 (0.1) | b-7 [0.2] | 11 |
| 19 (Invention) | No. 8 (0.1) | A-3 (0.2) | c-6 [0.2] | 11 |
| 20 (Invention) | No. 8 (0.1) | A-3 (0.2) | c-9 [0.2] | 10.5 |
| 21 (Invention) | No. 8 (0.05) | A-3 (0.1) | d-1 [0.3] | 11 |
| 22 (Invention) | No. 8 (0.05) | A-3 (0.1) | e-41 [0.4] | 11 |
| 23 (Invention) | No. 8 (0.05) | A-3 (0.15) | e-34 [0.2] | 11 |
| 24 (Invention) | No. 8 (0.05) | A-3 (0.1) | g-26 [0.2] | 11 |
| 25 (Invention) | No. 8 (0.05) | A-3 (0.2) | f-1 [0.5] | 10 |
| 26 (Invention) | No. 8 (0.05) | A-1 (0.1) | h-1 [0.2] | 10 |
| 27 (Invention) | No. 3 (0.1) | A-1 (0.1) | a-15 [0.1] | 9 |
| 28 (Invention) | No. 3 (0.95) | A-3 (0.1) | b-1 [0.1] | 10 |
| 29 (Invention) | No. 3 (0.05) | A-2 (0.1) | c-6 [0.2] | 10.5 |
| 30 (Invention) | No. 3 (0.1) | A-3 (0.2) | e-41 [0.4] | 10.5 |
| 31 (Invention) | No. 3 (0.1) | A-1 (0.15) | f-1 [0.5] | 9.5 |
| 32 (Invention) | No. 3 (0.1) | A-3 (0.2) | a-1 [0.2] | 8.5 |
| 33 (Invention) | No. 3 (0.1) | A-2 (0.2) | b-3 [0.4] | 10.5 |
| 34 (Invention) | No. 3 (0.05) | A-1 (0.2) | c-9 [0.4] | 10 |
| 35 (Invention) | No. 3 (0.05) | A-1 (0.1) | e-34 [0.2] | 10.5 |
| 36 (Invention) | No. 3 (0.05) | A-1 (0.1) | g-26 [0.2] | 10 |

TABLE 2

| Photosensitive Material No. | Sensitizing Dye (addition amount: g) | Titanocene Compound (addition amount: g) | Compound of (a) to (h) (addition amount: g) | Step Number (clear) of Gray Scale |
|---|---|---|---|---|
| 50 (Comparison) | — | A-1 (0.1) | — | 0 |
| 51 (Comparison) | — | A-2 (0.1) | — | 0 |
| 52 (Comparison) | — | A-3 (0.1) | — | 0 |
| 53 (Comparison) | $E_o$-1 (0.1) | A-1 (0.1) | — | 0.5 |
| 54 (Comparison) | $E_o$-1 (0.1) | A-2 (0.1) | — | 0.5 |
| 55 (Comparison) | $E_o$-1 (0.1) | A-3 (0.1) | — | 0.5 |
| 56 (Comparison) | $E_o$-1 (0.1) | A-3 (0.1) | a-15 [0.1] | 1 |
| 57 (Comparison) | $E_o$-1 (0.1) | A-3 (0.1) | b-1 [0.2] | 2 |
| 58 (Comparison) | $E_o$-1 (0.1) | A-3 (0.1) | b-6 [0.2] | 2 |
| 59 (Comparison) | $E_o$-1 (0.1) | A-3 (0.1) | d-1 [0.3] | 2 |
| 60 (Comparison) | $E_o$-1 (0.1) | A-3 (0.1) | e-41 [0.4] | 2 |
| 61 (Comparison) | $E_o$-1 (D.1) | A-3 (0.1) | f-1 [0.5] | 1 |
| 62 (Comparison) | $E_o$-1 (0.1) | A-3 (0.1) | h-1 [0.2] | 1 |

Alcohol-Soluble Eosine $E_o$-1

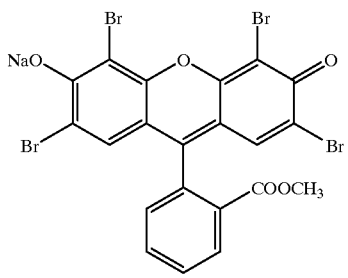

a-90

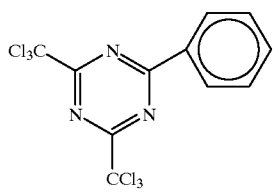

d-1

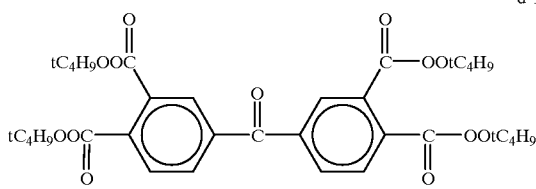

e-34

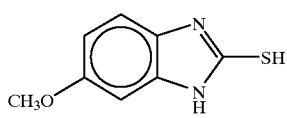

e-41

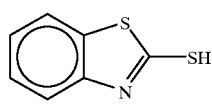

f-1

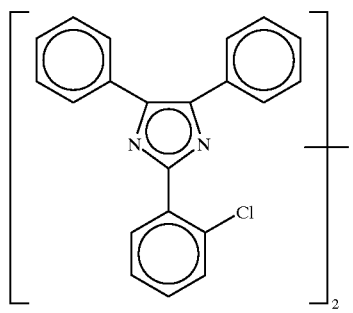

h-1

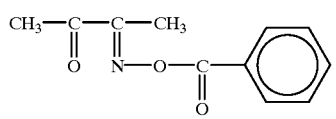

It is clearly seen from the results in Tables 1 and 2 that the photopolymerizable compositions of the present invention containing, as the photopolymerization initiation system, the sensitizing dye of the present invention and a titanocene compound exhibited high sensitivity. Further, when a compound of (a) to (h) was used in combination, still higher sensitivity could be obtained. On the contrary, when the photopolymerization initiation system contained no sensitizing dye but only contained a titanocene compound or even if a sensitizing dye was contained, when it was a dye different from the sensitizing dye of formula (I), the effect of the present invention could not be obtained.

EXAMPLE 2

Photosensitive Material Nos. 100 to 133 (Table 3) each was prepared in the same manner as in Example 1 except for using the photopolymerizable composition having the following composition for the formation of the photosensitive layer.

| | |
|---|---|
| Pentaerythritol tetraacrylate | 1.5 g |
| Benzyl methacrylate/methacrylic acid copolymer (copolymerization molar ratio: 75/25) | 2.0 g |

Photopolymerization initiation system (Table 3)

Sensitizing dye

Titanocene compound

Compound of (a) to (h)

| | |
|---|---|
| Fluorine-based nonionic surface active agent (F-177P) | 0.03 g |
| Thermal polymerization inhibitor: N-nitrosophenylhydroxylamine aluminum salt | 0.01 g |
| Pigment dispersion | 2.0 g |
| Composition of pigment dispersion: Composition: | |
| Pigment Blue 15:6 | 30 parts by weight |
| Allyl methacrylate/ methacrylic acid copolymer (copolymerization molar ratio: 83/17) | 20 parts by weight |
| Cyclohexanone | 35 parts by weight |
| Methoxypropyl acetate | 35 parts by weight |
| Propylene glycol monomethyl ether | 80 parts by weight |
| Methyl ethyl ketone | 20 g |
| Propylene glycol monomethyl ether | 20 g |

Photopolymerizable compositions were obtained in the same manner as the photopolymerizable compositions prepared above except for changing the sensitizing dye, the titanocene compound and the compound of (a) to (h) as shown in Table 4, and using each of these photopolymerizable compositions, Photosensitive Material Nos. 150 to 162 for comparison were prepared in the same manner as above.

The thus-prepared photosensitive materials were processed and examined on the properties in the same manner as in Example 1. The results obtained are shown in Tables 3 and 4. $E_o$-1 in the table is the same as used in Example 1.

TABLE 3

| Photosensitive Material No. | Sensitizing Dye (addition amount: g) | Titanocene Compound (addition amount: g) | Compound of (a) to (h) (addition amount: g) | Step Number (clear) of Gray Scale |
|---|---|---|---|---|
| 100 (Invention) | No. 57 (0.05) | A-3 (0.1) | — | 6 |
| 101 (Invention) | No. 58 (0.05) | A-3 (0.1) | — | 5.5 |
| 102 (Invention) | No. 61 (0.05) | A-3 (0.1) | — | 4 |
| 103 (Invention) | No. 88 (0.05) | A-3 (0.1) | — | 4.5 |
| 104 (Invention) | No. 64 (0.05) | A-2 (0.1) | — | 4 |
| 105 (Invention) | No. 65 (0.05) | A-2 (0.1) | — | 4 |
| 106 (Invention) | No. 78 (0.05) | A-2 (0.1) | — | 6 |
| 107 (Invention) | No. 60 (0.05) | A-2 (0.1) | — | 4 |
| 108 (Invention) | No. 90 (0.05) | A-1 (0.1) | — | 5.5 |
| 109 (Invention) | No. 71 (0.05) | A-1 (0.1) | — | 5 |
| 110 (Invention) | No. 69 (0.05) | A-3 (0.1) | — | 5 |
| 111 (Invention) | No. 69 (0.05) | A-3 (0.1) | a-15 [0.1] | 6 |
| 112 (Invention) | No. 69 (0.1) | A-3 (0.1) | a-90 [0.1] | 6 |
| 113 (Invention) | No. 69 (0.08) | A-3 (0.1) | a-33 [0.2] | 6 |
| 114 (invention) | No. 69 (0.05) | A-3 (0.1) | b-1 [0.2] | 7 |
| 115 (Invention) | No. 69 (0.05) | A-3 (0.1) | b-7 [0.2] | 7 |
| 116 (Invention) | No. 69 (0.1) | A-3 (0.2) | c-6 [0.2] | 7 |
| 117 (Invention) | No. 69 (0.1) | A-3 (0.2) | c-9 [0.2] | 6.5 |
| 118 (Invention) | No. 69 (0.05) | A-3 (0.1) | d-1 [0.3] | 7 |
| 119 (Invention) | No. 69 (0.05) | A-3 (0.1) | e-41 [0.4] | 7 |
| 120 (Invention) | No. 69 (0.05) | A-3 (0.1) | g-26 [0.2] | 7 |
| 121 (Invention) | No. 69 (0.05) | A-3 (0.2) | f-1 [0.5] | 6 |
| 122 (Invention) | No. 69 (0.05) | A-1 (0.1) | h-1 [0.2] | 6 |
| 123 (Invention) | No. 78 (0.05) | A-1 (0.1) | — | 4.5 |
| 124 (Invention) | No. 78 (0.1) | A-1 (0.1) | a-15 [0.1] | 5.5 |
| 125 (Invention) | No. 78 (0.05) | A-3 (0.1) | b-1 [0.1] | 6 |
| 126 (Invention) | No. 78 (0.05) | A-2 (0.1) | c-6 [0.2] | 6.5 |
| 127 (Invention) | No. 78 (0.1) | A-3 (0.2) | e-41 [0.4] | 6.5 |
| 128 (Invention) | No. 78 (0.1) | A-1 (0.15) | f-1 [0.5] | 5.5 |
| 129 (Invention) | No. 78 (0.1) | A-3 (0.2) | a-1 [0.2] | 5 |
| 130 (Invention) | No. 78 (0.1) | A-2 (0.2) | b-3 [0.4] | 6.5 |
| 131 (Invention) | No. 78 (0.05) | A-1 (0.2) | c-9 [0.4] | 6 |
| 132 (Invention) | No. 78 (0.05) | A-1 (0.1) | e-34 [0.2] | 6.5 |
| 133 (Invention) | No. 78 (0.05) | A-1 (0.1) | g-26 [0.2] | 6 |

TABLE 4

| Photosensitive Material No. | Sensitizing Dye (addition amount: g) | Titanocene Compound (addition amount: g) | Compound of (a) to (h) (addition amount: g) | Step Number (clear) of Gray Scale |
|---|---|---|---|---|
| 150 (Comparison) | — | A-1 (0.1) | — | 0 |
| 151 (Comparison) | — | A-2 (0.1) | — | 0 |
| 152 (Comparison) | — | A-3 (0.1) | — | 0 |
| 153 (Comparison) | $E_o$-1 (0.1) | A-1 (0.1) | — | 0 |
| 154 (Comparison) | $E_o$-1 (0.1) | A-2 (0.1) | — | 0 |
| 155 (Comparison) | $E_o$-1 (0.1) | A-3 (0.1) | — | 0 |
| 156 (Comparison) | $E_o$-1 (0.1) | A-3 (0.1) | a-15 [0.1] | 0.5 |
| 157 (Comparison) | $E_o$-1 (0.1) | A-3 (0.1) | b-1 [0.2] | 1 |
| 158 (Comparison) | $E_o$-1 (0.1) | A-3 (0.1) | c-6 [0.2] | 1 |
| 159 (Comparison) | $E_o$-1 (0.1) | A-3 (0.1) | d-1 [0.3] | 1 |
| 160 (Comparison) | $E_o$-1 (0.1) | A-3 (0.1) | e-41 [0.4] | 1 |
| 161 (Comparison) | $E_o$-1 (0.1) | A-3 (0.1) | f-1 [0.5] | 0.5 |
| 162 (Comparison) | $E_o$-1 (0.1) | A-3 (0.1) | h-1 [0.2] | 0.5 |

From the results in Tables 3 and 4, the same tendency as in Example 1 is verified.

EXAMPLE 3

Photosensitive Material Nos. 200 to 204 (Table 5) each was prepared in the same manner as in Example 1 except for using the photopolymerizable composition having the following composition for the formation of the photosensitive layer. The photosensitive materials obtained were examined on the properties in the same manner as above. The results are shown in Table 5. $E_o$-1 in the table is the same as used in Example 1.

| | |
|---|---|
| Pentaerythritol tetraacrylate | 1.8 g |
| Allyl methacrylate/methacrylic acid copolymer (copolymerization molar ratio: 75/25) | 1.7 g |

Photopolymerization initiation system (Table 5)

Sensitizing dye

Titanocene compound

Compound of (a) to (h)

| | | |
|---|---|---|
| Fluorine-based nonionic surface active agent (F-177P) | 0.03 | g |
| Thermal polymerization inhibitor: N-nitrosophenylhydroxylamine aluminum salt | 0.01 | g |
| Pigment dispersion | 2.0 | g |

Composition of pigment dispersion:

| Composition: | | |
|---|---|---|
| Pigment Blue 15:6 | 30 | parts by weight |
| Allyl methacrylate/ methacrylic acid copolymer (copolymerization molar ratio: 83/17) | 20 | parts by weight |
| Cyclohexanone | 35 | parts by weight |
| Methoxypropyl acetate | 35 | parts by weight |
| Propylene glycol monomethyl ether | 80 | parts by weight |
| Methyl ethyl ketone | 20 | g |
| Propylene glycol monomethyl ether | 20 | g |

TABLE 5

| Photosensitive Material No. | Sensitizing Dye (addition amount: g) | Titanocene Compound (addition amount: g) | Compound of (a) to (h) (addition amount: g) | Step Number (clear) of Gray Scale |
|---|---|---|---|---|
| 200 (Invention) | No. 57 (0.1) | A-3 (0.1) | c-9 [0.2] | 8 |
| 201 (Invention) | No. 58 (0.05) | A-3 (0.1) | c-9 [0.1] | 6 |
| 202 (Invention) | No. 85 (0.2) | A-3 (0.2) | c-9 [0.2] | 8.5 |
| 203 (Invention) | No. 86 (0.05) | A-3 (0.5) | c-9 [0.15] | 7 |
| 204 (Comparison) | $E_o$-1 (0.1) | A-3 (0.1) | c-9 [0.2] | 3 |

From the results in Table 5, the same tendency as in Example 2 can be seen.

The photopolymerizable composition of the present invention exhibits high sensitivity to actinic light rays over a wide region of from ultraviolet light to visible light. Accordingly, the light source which can be used includes an ultrahigh-pressure mercury lamp, a high-pressure mercury lamp, a medium-pressure mercury lamp, a low-pressure mercury lamp, a chemical lamp, a carbon arc lamp, a xenon lamp, a metal halide lamp, various laser lamps such as visible and ultraviolet laser lamps, a fluorescent lamp, a tungsten lamp and sunlight.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising i) an addition polymerizable compound having an ethylenically unsaturated double bond, ii) a sensitizing dye represented by the following formula (I) and iii) a titanocene compound:

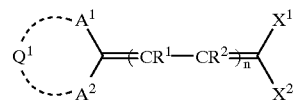

(I)

wherein $A^1$ and $A^2$ each represents a carbon atom or a hetero atom, $Q^1$ represents a nonmetallic atom group which forms a 5-membered heterocyclic ring together with $A^1$, $A^2$ and the carbon atom adjacent thereto, $R^1$ and $R^2$ each represents a hydrogen atom, an alkyl group or an aryl group and $R^1$ and $R^2$ may be combined with each other to form a ring, $X^1$ and $X^2$ each represents a cyano group or a substituted carbonyl group and $X^1$ and $X^2$ may be combined with each other to form a ring, and n represents 0, 1 or 2.

2. The photopolymerizable composition of claim 1, wherein the heterocyclic ring formed by $Q^1$, $A^1$, $A^2$ and the carbon atom which bonds to both $A^1$ and $A^2$ is selected from the group consisting of thiazoles, benzothiazoles, naphthothiazoles, benzoxazoles, benzimidazoles and 3,3-dialkylindolenines.

3. The photopolymerizable composition of claim 1, wherein $X^1$ and $X^2$ is combined with each other to form a ring represented by formula (Ia):

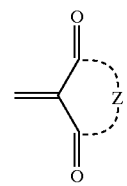

(Ia)

wherein Z represents a nonmetallic atom group necessary for forming a 5-, 6- or 7-membered hydrocarbon or heterocyclic ring which may have a substituent.

4. The photopolymerizable composition of claim 1, wherein the titanocene compound is at least one selected from the group consisting of dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcylopentadienyl-Ti-bis-2,3, 5,6-tetrafluorophen-1-yl, dimethylcyclopentadienyl-Ti-bis-2,4-difluorophen-1-yl, and bis(cyclopentadienyl)-bis(2,6-difluoro-3-(pyr-1-yl)-phenyl)titanium.

5. The photopolymerizable composition of claim 1, wherein the content of the sensitizing dye is from 0.05 to 30 parts by weight per 100 parts by weight of the addition polymerizable compound having an ethylenically unsaturated double bond.

6. The photopolymerizable composition of claim 1, wherein the content of the titanocene compound is from 0.5 to 100 parts by weight per 100 parts by weight of the addition polymerizable compound having an ethylenically unsaturated double bond.

7. The photopolymerizable composition of claim 1, which further contains at least one compound selected from the group consisting of the following compounds (a) to (h):

(a) a compound having a carbon-halogen bond;
(b) a ketone compound represented by the following formula (II):

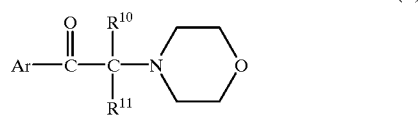

(II)

wherein Ar represents an aromatic group represented by the following formula, $R^{10}$ and $R^{11}$ each represents a hydrogen atom or an alkyl group, $R^{10}$ and $R^{11}$ may be combined with each other to form a ring together with the carbon atom, and the ring formed by $R^{10}$, $R^{11}$ and the carbon atom may be a divalent group linking the carbonyl group and the morpholino group:

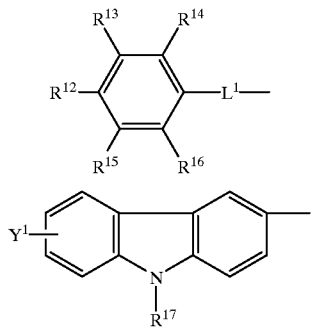

wherein $R^{12}$, $R^{13}$, $R^{14}$, $R^{15}$ and $R^{16}$, which may be the same or different, each represents a hydrogen atom, a halogen atom, an alkyl group, an alkenyl group, an aryl group, a hydroxyl group, an alkoxy group, —S—$R^{18}$, —SO—$R^{18}$ or —SO$_2$—$R^{18}$ where $R^{18}$ represents a hydrogen atom, an alkyl group or an alkenyl group, $L^1$ represents a bond or an alkylene group, provided that when $L^1$ is a bond, at least one of $R^{12}$, $R^{13}$, $R^{14}$, $R^{15}$ and $R^{16}$ is —S—$R^{18}$ or —SO—$R^{18}$, $R^{17}$ represents a hydrogen atom, an alkyl group or an acyl group, and $Y^1$ represents a hydrogen atom or a substituted carbonyl group represented by the following formula:

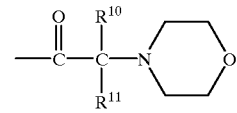

wherein $R^{10}$ and $R^{11}$ each has the same meaning as defined in formula (II);

(c) a ketoxime compound represented by formula (III):

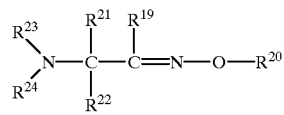

(III)

wherein $R^{19}$ and $R^{20}$, which may be the same or different, each represents an aliphatic hydrocarbon group, an aromatic hydrocarbon group or a heterocyclic group, $R^{21}$ and $R^{22}$, which may be the same or different, each represents a hydrogen atom, an aliphatic hydrocarbon group, an aromatic hydrocarbon group, a heterocyclic group, a hydroxy group, a substituted oxy group, a mercapto group or a substituted thio group, $R^{23}$ and $R^{24}$ each represents a hydrogen atom, an aliphatic hydrocarbon group, an aromatic hydrocarbon group or a substituted carbonyl group, $R^{23}$ and $R^{24}$ may be combined with each other to form a ring having from 2 to 8 carbon atoms, and the ring may contain at least one of —O—, —NR$^{23}$— where $R^{23}$ has the same meaning as above, —O—CO—, —NH—CO—, —S— and —SO$_2$— in the linking main chain;

(d) an organic peroxide;
(e) a thio compound represented by the following formula (IV):

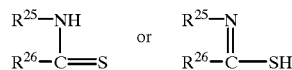

(IV)

wherein $R^{25}$ represents an alkyl group or an aryl group, $R^{26}$ represents a hydrogen atom or an alkyl group, $R^{25}$ and $R^{26}$ may be combined with each other to provide an atomic group necessary for completing a heterocyclic ring which may have a condensed ring, together with the carbon atom and the nitrogen atom;

(f) hexaarylbiimidazole;
(g) an aromatic onium salt; and
(h) a ketoxime ester.

8. The photopolymerizable composition of claim 7, wherein the total amount of compounds (a) to (h) contained is 0.5 to 100 parts by weight per 100 parts by weight of the addition polymerizable compound having an ethylenically unsaturated double bond.

9. The photopolymerizable composition of claim 1 wherein n represents 1 or 2.

* * * * *